(12) United States Patent
Kaloyeros et al.

(10) Patent No.: US 12,065,737 B2
(45) Date of Patent: Aug. 20, 2024

(54) SILICON-BASED THIN FILMS FROM N-ALKYL SUBSTITUTED PERHYDRIDOCYCLOTRISILAZANES

(71) Applicant: Gelest, Inc., Morrisville, PA (US)

(72) Inventors: Alain E. Kaloyeros, Slingerlands, NY (US); Barry C. Arkles, Pipersville, PA (US)

(73) Assignee: GELEST, INC., Morrisville, PA (US)

( * ) Notice: Subject to any disclaimer, the term of this patent is extended or adjusted under 35 U.S.C. 154(b) by 0 days.

(21) Appl. No.: 17/331,206

(22) Filed: May 26, 2021

(65) Prior Publication Data

US 2021/0371981 A1 Dec. 2, 2021

Related U.S. Application Data

(60) Provisional application No. 63/030,684, filed on May 27, 2020.

(51) Int. Cl.
*C23C 16/455* (2006.01)
*C23C 16/34* (2006.01)
(Continued)

(52) U.S. Cl.
CPC ...... *C23C 16/45553* (2013.01); *C23C 16/345* (2013.01); *C23C 16/4401* (2013.01); *C23C 16/4554* (2013.01); *C23C 16/52* (2013.01)

(58) Field of Classification Search
CPC .......... C23C 16/45553; C23C 16/4554; C23C 16/4401; C23C 16/345; C23C 16/52
See application file for complete search history.

(56) References Cited

U.S. PATENT DOCUMENTS 4,200,666 A 4/1980 Reinberg
4,595,775 A 6/1986 Arkles
(Continued)

FOREIGN PATENT DOCUMENTS

CN 106611702 A 5/2017
EP 2644609 A2 10/2013
(Continued)

OTHER PUBLICATIONS

STIC search, conducted Jul. 19, 2021 (Year: 2021).*
(Continued)

*Primary Examiner* — Michael G Miller
(74) *Attorney, Agent, or Firm* — Panitch Schwarze Belisario & Nadel LLP

(57) ABSTRACT

Low to moderate temperature vapor deposition processes are provided for the deposition of silicon-based thin films, such as silicon nitride films, silicon carbonitride films, silicon oxide films, and silicon films. The processes includes in a single cycle, heating a substrate to a predetermined temperature; providing a precursor containing an N-alkyl substituted perhydridocyclotrisilazane in the vapor phase to a reaction zone containing the substrate, forming a monolayer of the precursor by adsorption to the substrate surface, and exposing the adsorbed monolayer on the substrate in the reaction zone to a remote or direct soft plasma of a co-reactant. The adsorbed precursor monolayer reacts with the soft plasma and undergoes conversion to a discrete atomic or molecular layer of a silicon-based thin film via dissociation and/or decomposition due to or enabled by a substrate surface-induced process. The cycle is then repeated to form a silicon-based thin film of a desired thickness.

9 Claims, 15 Drawing Sheets

(51) Int. Cl.
  *C23C 16/44* (2006.01)
  *C23C 16/52* (2006.01)

(56) References Cited

U.S. PATENT DOCUMENTS

| | | | |
|---|---|---|---|
| 5,008,422 | A | 4/1991 | Blum et al. |
| 5,190,792 | A | 3/1993 | Blum et al. |
| 5,451,260 | A | 9/1995 | Versteeg et al. |
| 6,346,477 | B1 | 2/2002 | Kaloyeros et al. |
| 6,518,168 | B1 | 2/2003 | Clem et al. |
| 6,524,764 | B1 | 2/2003 | Tomikawa et al. |
| 6,527,855 | B2 | 3/2003 | DelaRosa et al. |
| 6,586,056 | B2 | 7/2003 | Arkles et al. |
| 6,800,134 | B2 | 10/2004 | Dando et al. |
| 9,809,608 | B2 | 11/2017 | Jang et al. |
| 9,981,286 | B2 | 5/2018 | Woodruff et al. |
| 2002/0081381 | A1 | 6/2002 | DelaRosa et al. |
| 2003/0054638 | A1 | 3/2003 | Saito et al. |
| 2006/0019029 | A1 | 1/2006 | Hamer et al. |
| 2006/0024964 | A1 | 2/2006 | Seo et al. |
| 2007/0012249 | A1 | 1/2007 | Miyazawa |
| 2007/0066508 | A1 | 3/2007 | Chen et al. |
| 2007/0123060 | A1 | 5/2007 | Rahtu |
| 2007/0202254 | A1 | 8/2007 | Ganguli et al. |
| 2007/0238268 | A1* | 10/2007 | Leusink ............ H01L 21/31662 438/478 |
| 2007/0251446 | A1 | 11/2007 | Dahl et al. |
| 2007/0254488 | A1 | 11/2007 | Huotari et al. |
| 2009/0269507 | A1 | 10/2009 | Yu et al. |
| 2009/0297710 | A1* | 12/2009 | Lindfors ............... C23C 16/403 118/728 |
| 2010/0093184 | A1 | 4/2010 | Wu et al. |
| 2011/0256734 | A1 | 10/2011 | Hausmann et al. |
| 2013/0189840 | A1 | 7/2013 | Fu et al. |
| 2013/0219170 | A1 | 8/2013 | Naitou et al. |
| 2013/0260555 | A1 | 10/2013 | Zope et al. |
| 2014/0051264 | A1 | 2/2014 | Mallick et al. |
| 2014/0256128 | A1 | 9/2014 | Spurlin et al. |
| 2014/0273528 | A1 | 9/2014 | Niskanen et al. |
| 2015/0030782 | A1 | 1/2015 | Ivanov et al. |
| 2015/0079342 | A1 | 3/2015 | Boyd et al. |
| 2015/0125122 | A1 | 5/2015 | Winarski |
| 2016/0093485 | A1 | 3/2016 | Kobayashi et al. |
| 2016/0280724 | A1 | 9/2016 | Arkles et al. |
| 2016/0358772 | A1 | 12/2016 | Xie et al. |
| 2017/0062210 | A1 | 3/2017 | Visser et al. |
| 2017/0114451 | A1 | 4/2017 | Lecordier |
| 2017/0114453 | A1 | 4/2017 | Chen et al. |
| 2018/0122687 | A1 | 5/2018 | Cooper et al. |
| 2018/0291505 | A1 | 10/2018 | Nguyen et al. |
| 2018/0308701 | A1 | 10/2018 | Na et al. |
| 2018/0342390 | A1 | 11/2018 | Xiao et al. |
| 2019/0249296 | A1* | 8/2019 | Jang .................. C23C 16/45544 438/685 |
| 2019/0345609 | A1 | 11/2019 | Chen et al. |

FOREIGN PATENT DOCUMENTS

| | | | |
|---|---|---|---|
| EP | 3274354 | B1 | 7/2019 |
| JP | 2012-067383 | A | 4/2012 |
| TW | 201447012 | A | 12/2014 |
| TW | 201940734 | A | 10/2019 |
| WO | 2008013659 | A2 | 1/2008 |
| WO | WO-2019199682 | A1 * | 10/2019 ....... C23C 16/45536 |

OTHER PUBLICATIONS

Arkles et al., "Synthesis and Exploratory Deposition Studies of Isotetrasilane and Reactive Intermediates for Epitaxial Silicon," Inorganic Chemistry, vol. 58, pp. 3050-3057 (2019).
Arkles, Barry, "Silicon Nitride from Organosilazane Cyclic and Linear Prepolymers," Journal of the Electrochemical Society, vol. 133, No. 1, pp. 233-234 (1986).
Breed et al., "The Synthesis and Properties of N-Substituted Cyclotrisilazanes," Inorganic Chemistry, vol. 3, No. 11, pp. 1622-1627 (1964).
Brooks et al., "Deposition chemistry and structure of plasma-deposited silicon nitride films from 1,1,3,3,5,5-hexamethylcyclotrisilazane," J. Appl. Phys., vol. 64, No. 2, pp. 841-848 (Jul. 15, 1988).
Brunets et al., "Low-temperature LPCVD of Si nanocrystals from disilane and trisilane (Silcore®) embedded in ALD-alumina for non-volatile memory devices," Surface & Coatings Technology, vol. 201, pp. 9209-9214 (2007).
Büyükyazi et al., "A cobalt(II)heteroarylalkenolate precursor for homogeneous Co3O4 coatings by atomic layer deposition," Dalton Trans., vol. 46, pp. 12996-13001 (2017).
Cyclic Precursors for Gap Fill Depositions of SiO2 in Trenches in Microelectronics Fabrication using Silicon Containing Compounds, Mar. 11, 2010, downloaded from web page: IP.com, Download date: May 19, 2016, original posting date: unknown, 45 pages.
Cyclic Precursors for Gap Fill Depositions, Prior Art Database, Mar. 11, 2010, downloaded from web page: hyyp://priorartdatabase.com/PCOM/000193876, Download Date: Aug. 4, 2016, original posting date: unknown, 14 pages.
Fleischer et al., "Bis(dichlorosilyl)methylamine—Synthesis, Crystal Structure, and Conformational Analysis in the Gas Phase," Z. Anorg. Allg. Chem., vol. 625, pp. 313-320 (1999).
Gumpher, et al., "Characterization of Low-Temperature Silicon Nitride LPCVD from Bis(tertiary-butylamino)silane and Ammonia," Journal of The Electrochemical Society, vol. 151, No. 5, pp. G353-G359 (2004).
Hagen et al., "Atomic layer deposition of metals: Precursors and film growth," Applied Physics Review, vol. 6, No. 4, 2 pages (2019) (Abstract Only).
Hochberg et al., "Diethylsilane as a Silicon Source for the Deposition of Silicon Nitride and Silicon Oxynitride Films by LPCVD," MRS Proceedings, vol. 204, pp. 509-514, doi: 10.1557/PROC-204-509 (1991).
Huang et al., "Design of efficient mono-aminosilane precursors for atomic layer deposition of SiO2 thin films," RSC Adv., vol. 7, pp. 22672-22678 (2017).
Imai et al., "Hydrogen atom assisted ALE of silicon," Applied Surface Science, vol. 82-82, pp. 322-326 (1994).
International Search Report and Written Opinion issued Jan. 13, 2020 in International Application No. PCT/US2019/036515.
International Search Report and Written Opinion issued Jun. 11, 2020 in International Application No. PCT/US2020/024608.
Int'l Preliminary Report on Patentability issued Oct. 5, 2017 in Int'l Application No. PCT/US2016/022916.
Int'l Search Report and Written Opinion issued Jun. 10, 2016 in Int'l Application No. PCT/US2016/022916.
Isoda et al., "Perhydropolysilazane Precursors to Silicone Nitride Ceramics," Journal of Inorganic and Organometallic Polymers, vol. 2, No. 1, pp. 151-160 (1992).
Ivanova et al., "The Effects of Processing Parameters in the Chemical Vapor Deposition of Cobalt from Cobalt Tricarbonyl Nitrosyl," Journal of the Electrochemical Society, vol. 146, No. 6, pp. 2139-2145 (1999).
Kaloyeros et al., "Review-Cobalt Thin Films: Trends in Processing Technologies and Emerging Applications," ECS Journal of Solid State Science and Technology, vol. 8, No. 2, pp. P119-P152 (2019).
Kilic et al., Precursor-surface interactions revealed during plasma-enhances atomic layer deposition of metal layer deposition of metal oxide thin films by in-situ spectroscopic ellipsometry, Scientific Reports, vol. 10, No. 10392, pp. 1-12 (2020).
Klesko et al., "Low Temperature Thermal Atomic Layer Deposition of Cobalt Metal Films," Chemistry of Materials, vol. 28, pp. 700-703 (2016).
Lee et al., "Subnanometer cobalt oxide clusters as selective low temperature oxidative dehydrogenation catalysts," Nature Communications, vol. 10, No. 9541, pp. 1-9 (2019) https://doi.org/10.1038/s41467-019-08819-5.
Leskelä et al., "Atomic layer deposition (ALD): from precursors to thin film structures," Thin Solid Films, vol. 409, pp. 138-146 (2002).

(56) References Cited

OTHER PUBLICATIONS

Office Action issued Feb. 13, 2018 in U.S. Appl. No. 15/070,693, by Arkles.
Office Action issued Mar. 27, 2020 in U.S. Appl. No. 16/738,641, by Arkles.
Office Action issued Apr. 2, 2021 in U.S. Appl. No. 17/151,895, by Arkles.
Office Action issued Apr. 23, 2019 in U.S. Appl. No. 15/070,693, by Arkles.
Office Action issued May 5, 2021 in U.S. Appl. No. 17/151,895, by Arkles.
Office Action issued Jul. 9, 2018 in EP Application No. 16714133.2.
Office Action issued Aug. 19, 2020 in U.S. Appl. No. 16/738,641, by Arkles.
Office Action issued Sep. 17, 2020 in TW Application No. 109110891.
Office Action issued Sep. 24, 2019 in U.S. Appl. No. 15/070,693, by Arkles.
Office Action issued Oct. 12, 2018 in U.S. Appl. No. 15/070,693, by Arkles.
Office Action issued Oct. 15, 2018 in EP Application No. 16714133.2.
Office Action issued Nov. 5, 2020 in U.S. Appl. No. 15/070,693, by Arkles.
Office Action issued Nov. 27, 2020 in U.S. Appl. No. 16/738,641, by Arkles.
Rayez et al., "Structures and Si-N bond strengths of some cyclodi- and cyclotrisilazanes," Journal of Molecular Structure (Theochem), vol. 487, pp. 241-250 (1999).
Semenova et al., Reaction of Dialkyldichloro—and Alkyldichloro—Silanes with Methylamine, (pp. 1945-1947; translated from Izvestiya Academii Nauk, SSSR, Ordelenie Khimicheskikh Nauk, No. 11, pp. 2036-2039 (1962).
Seyferth et al., "Synthesis and Polymerization of Cyclotetrasilazanes," Applied Organometallic Chemistry, vol. 11, pp. 813-832 (1997).
Tanaka et al., "Film Properties of Low-k Silicon Nitride Films Formed by Hexachlorodisilane and Ammonia," Journal of the Electrochemical Society, vol. 147, No. 6, pp. 2284-2289 (2000).
Vos et al., "Atomic Layer Deposition of Cobalt Using H2-, N2-, and NH3-Based Plasmas: On the Role of the Co-reactant," J. Phys. Chem., vol. 122, pp. 22519-22529 (C 2018).
Written Opinion issued Sep. 3, 2020 in International Application No. PCT/US2019/036515.
Written Opinion issued Nov. 6, 2020 in International Application No. PCT/US2019/036515.
Yu et al., "Synthesis of silicon oxynitride from a polymeric precursor," Journal of Material Science, vol. 29, No. 6, pp. 1680-1685 (1994).
Guruvenket et al., "Atmospheric Pressure Plasma CVD of Amorphous Hydrogenated Silicon Carbonitride (a-SiCN:H) Films Using Triethylsilane and Nitrogen," Plasma Process. Polym., vol. 8, pp. 1126-1136 (2011).
Kaloyeros et al., "Review-Silicon Nitride and Silicon Nitride-Rich Thin Film Technologies: Trends in Deposition Techniques and Related Applications," ECS Journal of Solid State Science and Technology, vol. 6, No. 10, pp. P691-P714 (2017).
Kaloyeros et al., "Review-Silicon Nitride and Silicon Nitride-Rich Thin Film Technologies: State-of-the-Art Processing Technologies, Properties, and Applications," ECS Journal of Solid State Science and Technology, vol. 9:063006, 53 pages (2020).
Kim et al., "Investigation of the Physical Properties of Plasma Enhanced Atomic Layer Deposited Silicon Nitride as Etch Stopper," ACS Applied Materials & Interfaces, vol. 10, No. 51, pp. 44825-44833 (2018).
Meng et al., "Atomic Layer Deposition of Silicon Nitride Thin Films: A Review of Recent Progress, Challenges, and Outlooks," Materials, vol. 9, No. 1007, pp. 1-20 (2016).
Park et al., "Novel Cyclosilazane-Type Silicon Precursor and Two-Step Plasma for Plasma-Enhanced Atomic Layer Deposition of Silicon Nitride," ACS Applied Materials & Interfaces, vol. 10, pp. 9155-9163 (2018).
International Search Report and Written Opinion issued Sep. 23, 2021 in International Application No. PCT/US2021/034322.
Volodin et al., "Evolution of Silicon and Hydrogen Bonding in Silicon-Rich Nitride Films Prepared by Plasma-Enhanced Chemical Vapor Deposition and Annealed Under High Pressure," Nanoscience and Nanotechnology Letters, vol. 4, pp. 364-368 (2012).
Kerber et al., "The nature of hydrogen in x-ray photoelectron spectroscopy: General patterns from hydroxides to hydrogen bonding," J. Vac. Sci. Technol. A, vol. 14, No. 3, pp. 1314-1320 (1996).
Boehme et al., "H loss mechanism during anneal of silicon nitride: Chemical dissociation," Journal of Applied Physics, vol. 88, No. 10, pp. 6055-6059 (2000).
Stojilovic, "Why Can't We See Hydrogen in X-ray Photoelectron Spectroscopy?", Journal of Chemical Education, vol. 89, pp. 1331-1332 (2012).
Stein, "Hydrogen Content and Annealing of Memory Quality Silicon-Oxynitride Films," Journal of Electronic Materials, vol. 5, No. 2 (1976).
Bruyere et al., "Annealing of silicon nitride thin films prepared by plasma-enhanced chemical vapor deposition with helium dilution," Thin Solid Films, vol. 221, pp. 65-71 (1992).
Szweda, "Annealing Effects in Silicon Nitride Encapsulant Films," Physica, vol. 129B, pp. 435-439 (1985).
Cho et al., "Remote Plasma Atomic Layer Deposition of SiNx Using Cyclosilazane and H2/N2 Plasma," Applied Sciences, vol. 9, pp. 1-10 (2019).
Meng et al., "Hollow Cathode Plasma-Enhanced Atomic Layer Deposition of Silicon Nitride Using Pentachlorodisilane," ACS Applied Materials & Interfaces, vol. 10, pp. 14116-14123 (2018).
Ahnood et al., "Pulsed-Radio frequency plasma enhanced chemical vapour deposition of low temperature silicon nitride for thin film transistors," Thin Solid Films, vol. 520, pp. 4831-4834 (2012).
Takeyama et al., "Characterization of silicon nitride thin films deposited by reactive sputtering and plasma-enhanced CVD at low temperatures," Japanese Journal of Applied Physics, vol. 53, pp. 05GE01-1 to 05GE01-3 (2014).
Mackel et al., "Detailed study of the composition of hydrogenated SiNx layers for high-quality silicon surface passivation," Journal of Applied Physics, vol. 92, pp. 2602-2609 (2002).
Raja et al., "4.9: X-ray Photoelectron Spectroscopy" in Physical Methods in Chemistry and Nano Science, LibreTexts, pp. 1-10 (downloaded Nov. 2022).
Tolstoy et al., Handbook of Infrared Spectroscopy of Ultrathin Films, Wiley Interscience, New Jersey, pp. 1-710 (2003).
International Preliminary Report on Patentability with Written Opinion issued Dec. 8, 2022 in PCT/US2021/034322.
Office Action and Search Report issued Nov. 4, 2022 in TW Application No. 110119293 .
Office Action issued Feb. 27, 2024 in JP Application No. 2022-572442.
Morin et al., "Study of stress in tensile nitrogen-plasma-treated multilayer silicon nitride films," J. Vac. Sci. Technol., vol. 29, No. 4, pp. 041513-1-041513-8 (2011).
Peercy et al., "Hydrogen concentration profiles and chemical bonding in silicon nitride," Journal of Electronic Materials, vol. 8, No. 1, pp. 11-24 (1979).

* cited by examiner

SILICON-BASED THIN FILMS FROM N-ALKYL SUBSTITUTED PERHYDRIDOCYCLOTRISILAZANES

CROSS REFERENCE TO RELATED APPLICATION

This application claims priority to U.S. Provisional Patent Application No. 60/030,684, filed May 27, 2020, the disclosure of which is herein incorporated by reference.

BACKGROUND OF THE INVENTION

Research, development, and manufacturing interests in Si-based thin films, such as ($SiN_x$) and silicon oxide ($SiO_2$), are at an unprecedented intensity, driven not only by the need to extend its historical applicability in the ever evolving integrated circuitry (IC) and solar cell industries, but also by its potential use in a myriad of new applications. The latter include, for instance, host matrices for Si nanocrystals (Si—NCs) and quantum dots (QDs) for photoluminescence applications, waveguides in nonlinear frequency combs for sensors and photonic devices for telecommunications, tunable luminescent films for Si-based light emitting diodes (LEDs) in Si based monolithic optoelectronic integration, passivation/encapsulation nanostructures at the interface with gallium arsenide (GaAs) for compound semiconductor devices, and base platform for integration with biological materials for biochemistry and medical applications.

The tremendous appeal of Si-based thin films is propelled by its highly attractive mix of physical, chemical, mechanical, electrical, and optoelectronic properties, which make it one of the most commonly used materials across a diversified array of industries. Many of these industries share the same evolutionary drivers in terms of migration towards the incorporation of heterodevice structures with smaller feature sizes using thermally and/or chemically sensitive substrates. As a result, R&D activities have focused on the development and optimization of low-temperature deposition processes, such as direct and remote plasma-enhanced chemical vapor deposition (PE-CVD), laser-assisted CVD, mirror-plasma enhanced chemical vapor deposition (MPECVD), multiple-holes hollow-cathode radio-frequency (RF) PECVD, and direct, remote, and glow-discharge plasma-enhanced atomic layer deposition.

Despite these extensive R&D efforts, significant challenges must be overcome to enable the extendibility of Si-based thin films to heterodevice applications. For one, the lion share of PE-CVD and PE-ALD processes rely on the use of silane ($SiH_4$) and silane-type precursors. The inherent issues associated with the use of such chemistries are well documented and include their pyrophoric nature, increased thermal budget, and the incorporation of high levels of hydrogen. In addition, PE-ALD processes using silane-type silicon sources suffer from substrate surface adsorption and nucleation problems, thus requiring substrate surface pretreatment which adds complexity and cost. Furthermore, the resulting films consist quite frequently of varying concentrations of silicon, oxygen, and nitrogen, with the inclusion of significant levels of contaminants, and/or the presence of Si to N and Si to O compositional gradients between the interfacial, bulk, and surface regions of the films.

For these reasons, it is desirable to provide a thin film deposition technique that overcomes the above-discussed drawbacks of conventional deposition techniques by depositing high-quality Si-based thin films, such as ($SiN_x$) and silicon oxide ($SiO_2$), as well as their alloys, such as $SiC_xN_y$, at low temperature, while minimizing the number and complexity of substrate surface pre-treatment steps and thereby maximizing process efficiency and productivity.

BRIEF SUMMARY OF THE INVENTION

In one embodiment, the present disclosure relates to a method for deposition of a silicon nitride thin film onto a substrate in a reaction zone of a deposition chamber, the method comprising, in a single cycle: heating a substrate to a temperature of about 200° C. to about 650° C.; maintaining the substrate at about 200° C. to about 650° C.; providing a precursor comprising a N-alkyl substituted perhydridocyclotrisilazane in the vapor phase with a carrier gas and/or under vacuum to the reaction zone containing the substrate; forming a monolayer of the N-alkyl substituted perhydridocyclotrisilazane by adsorption to the substrate surface; and exposing the adsorbed monolayer on the substrate in the reaction zone to a remote or direct soft plasma of a nitrogen-containing reactant; wherein the adsorbed N-alkyl substituted perhydridocyclotrisilazane monolayer reacts with the soft plasma and undergoes conversion to a discrete atomic or molecular layer of a silicon nitride thin film via dissociation and/or decomposition due to or enabled by a substrate surface-induced process; and wherein byproducts of the conversion are removed from the reaction zone via a purge step with an inert gas and/or the vacuum.

In a second embodiment, a method for deposition of a silicon oxide thin film onto a substrate in a reaction zone of a deposition chamber comprises, in a single cycle: heating a substrate to a temperature of about 200° C. to about 650° C.; maintaining the substrate at about 200° C. to about 650° C.; providing a precursor comprising a N-alkyl substituted perhydridocyclotrisilazane in the vapor phase with a carrier gas and/or under vacuum to the reaction zone containing the substrate; forming a monolayer of the N-alkyl substituted perhydridocyclotrisilazane by adsorption to the substrate surface; and exposing the adsorbed monolayer on the substrate in the reaction zone to a remote or direct soft plasma of an oxygen-containing reactant; wherein the adsorbed N-alkyl substituted perhydridocyclotrisilazane monolayer reacts with the soft plasma and undergoes conversion to a discrete atomic or molecular layer of a silicon oxide thin film via dissociation and/or decomposition due to or enabled by a substrate surface-induced process; and wherein byproducts of the conversion are removed from the reaction zone by an inert gas through a purge step and/or the vacuum.

In a further embodiment, the disclosure provides a method for deposition of a silicon carbonitride thin film onto a substrate in a reaction zone of a deposition chamber, the method comprising, in a single cycle: heating a substrate to a temperature of room temperature to about 200° C.; maintaining the substrate at room temperature to about 2000° C.; providing a precursor comprising a N-alkyl substituted perhydridocyclotrisilazane in the vapor phase with a carrier gas and/or under vacuum to the reaction zone containing the substrate; forming a monolayer of the N-alkyl substituted perhydridocyclotrisilazane by adsorption to the substrate surface; and exposing the adsorbed monolayer on the substrate in the reaction zone to a remote or direct soft plasma of a nitrogen-containing reactant; wherein the adsorbed N-alkyl substituted perhydridocyclotrisilazane monolayer reacts with the soft plasma and undergoes conversion to a discrete atomic or molecular layer of a silicon carbonitride thin film via dissociation and/or decomposition due to or enabled by a substrate surface-induced process; and wherein byproducts of the conversion are removed from the reaction zone by an inert gas through a purge step and/or the vacuum.

In another embodiment, the disclosure provides method for deposition of a silicon thin film onto a substrate in a reaction zone of a deposition chamber, the method comprising, in a single cycle: heating a substrate to a temperature of about 200° C. to about 650° C.; maintaining the substrate at about 200° C. to about 650° C.; providing a precursor comprising a N-alkyl substituted perhydridocyclotrisilazane in the vapor phase with a carrier gas and/or under vacuum to the reaction zone containing the substrate; forming a monolayer of the N-alkyl substituted perhydridocyclotrisilazane by adsorption to the substrate surface, and exposing the adsorbed monolayer on the substrate in the reaction zone to a remote or direct soft plasma of a hydrogen-containing reactant; wherein the adsorbed N-alkyl substituted perhydridocyclotrisilazane monolayer reacts with the soft plasma and undergoes conversion to a discrete atomic or molecular layer of a silicon thin film via dissociation and/or decomposition due to or enabled by a substrate surface-induced process; and wherein byproducts of the conversion are removed from the reaction zone by an inert gas through a purge step and/or the vacuum.

BRIEF DESCRIPTION OF THE SEVERAL VIEWS OF THE DRAWINGS

The following detailed description of preferred embodiments of the present invention will be better understood when read in conjunction with the appended drawing. For the purposes of illustrating the invention, there is shown in the drawing an embodiment which is presently preferred. It is understood, however, that the invention is not limited to the precise arrangements and instrumentalities shown. In the drawings.

DETAILED DESCRIPTION OF THE INVENTION

Figure 1:
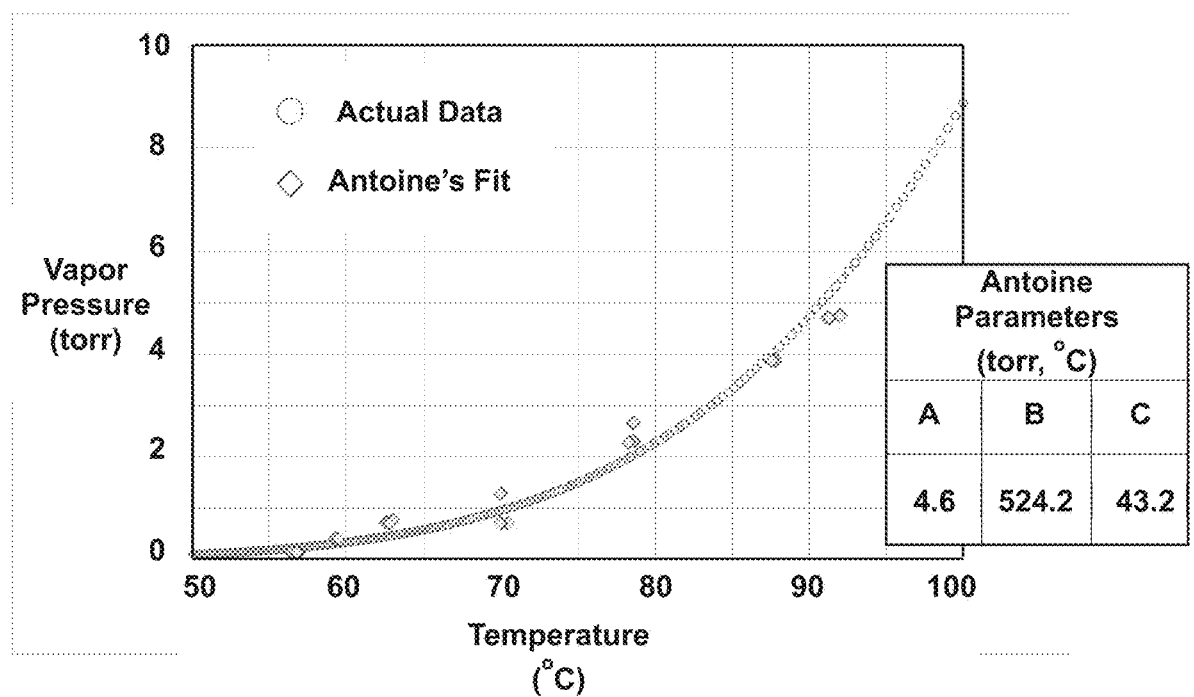
FIG. 1 is a graph of TICZ experimental vapor pressure data and Antoine Equation's fit over the range of 0.14 to 760 torr.

Aspects of the disclosure relate to low to moderate temperature vapor deposition processes for the deposition of Si-based thin films onto substrates in the reaction zone of a deposition chamber. The processes include, in a single cycle, heating a substrate to a desired temperature and maintaining the substrate at this temperature, providing a precursor comprising an N-alkyl substituted perhydridocyclotrisilazane in the vapor phase with a carrier gas and/or under vacuum to a reaction zone containing the substrate, forming a monolayer of the N-alkyl substituted perhydridocyclotrisilazane by adsorption on the substrate surface, optionally removing unreacted perhydridocyclotrisilazane and byproducts thereof from the reaction zone using an inert gas through a purge step and/or the vacuum, and exposing the adsorbed monolayer on the substrate in the reaction zone to a remote or direct soft plasma of another chemical species or co-reactant, wherein the adsorbed N-alkyl substituted perhydridocyclotrisilazane monolayer reacts with the soft plasma and undergoes conversion to a discrete atomic or molecular layer of a Si-based thin film via dissociation and/or decomposition due to or enabled by a substrate surface-induced process, in which byproducts of the conversion are removed from the reaction zone by an inert gas via a purge step and/or the vacuum. The single cycle is then repeated as many times as desired to form a Si-based thin film of a desired or predetermined thickness. As described in detail below, the appropriate substrate temperature and the components of the soft plasma are determined by the desired chemical composition of the silicon-based thin film, such as silicon nitride, silicon carbonitride, silicon oxide, or silicon.

The term "thin film" is well understood in the art, and may include films ranging in thickness from a few nanometers to a few microns. As explained above, such film thickness is controlled by the number of cycles which are performed.

In some embodiments, the conversion of the adsorbed monolayer to a discrete atomic or molecular layer may be aided or enabled by energy transfer provided from an energy source, such as a heated substrate. For example, surface-induced processes, such as energy transfer (thermal exposure) from the substrate, remote or direct plasma application, oxidation, and/or reduction may be used to initiate or facilitate conversion of the adsorbed monolayer to the final deposited film.

The term "soft plasma" refers to plasma-induced processes which impart minimum energy onto a subject film or substrate so as to result in very little or no mechanical, chemical, physical, or electrical damage to the film and substrate. Similarly, soft plasma refers to plasma-induced processes which impart energy onto the subject molecule which is lower than the threshold for breakage, fragmentation, or decomposition of the subject molecule. Instead, a soft plasma is designed to impart sufficient activation energy to the precursor to enable its controlled decomposition in combination with an additional source of thermal energy, preferably on a substrate surface.

The processes described herein employ as Si source precursors the class of N-alkyl substituted perhydridocyclotrisilazanes. Unlike perhydridocyclic silazanes with methyl groups on the N atoms, this class of silazanes contains alkyl radicals with at least two carbon atoms on each N atom, providing a mechanism for low to moderate temperature $SiN_x$ deposition by elimination of the alkyl substitutions. In contrast, the simple methyl groups in the methyl-substituted perhydridocyclic silazanes require higher temperatures for film formation and incorporate significantly higher carbon concentration into the resulting films. This is presumably due to the lack of a low-energy elimination mechanism for these methyl groups.

The favorable chemical structure and bonding configuration of the N-alkyl substituted perhydridocyclotrisilazanes have been engineered to enable the clean removal of the alkyl groups at low to moderate temperature to yield pure Si-based thin films. Furthermore, the presence of H atoms on the Si atoms minimizes the steric hindrance and provides the precursor molecule higher accessibility to reactive substrate surface sites, whether those sites are H-terminated (such as Si) or HO-terminated (such as $SiO_2$). In other words, the precursor adsorption to the substrate surface and possible partial decomposition through breakage of some of its ligands is immediate upon contact with the substrate. This feature has important implications, as film nucleation and growth can occur instantaneously in the first cycle without the existence of an incubation period, in contrast to what is reported in the prior art, thus eliminating the need for substrate surface pre-treatments that result in additional complexity and added cost of ownership.

The film-forming processes according to the disclosure are plasma-activated, not plasma-enhanced or plasma-assisted. In a plasma activated process, the precursor exposure step is carried out thermally without the involvement of a plasma, while the co-reactant (such as, for example, $NH_3$, $N_2$, $N_2+H_2$, hydrazine, oxygen, ozone, water, or $H_2$) is introduced in a direct or remote soft plasma. As such, the precursor adsorption step is activated by thermal and chemical energy from the substrate and not from a plasma, which enables the precursor (or a partial precursor species due to the possible elimination of some of the precursor ligands or attached radicals and groups upon engagement with the substrate) to adsorb physically or chemically in a conformal fashion to the various substrate surface topographies, including, for example, high aspect ratio via and trench structures. As a result, the subsequent remote or direct co-reactant plasma will lead to the formation of the desired film conformally with equal thickness across the entire substrate surface, including in highly aggressive device geometries.

The processes according to the disclosure are performed at a substrate temperature that leads to partial or complete decomposition of the pulsed precursor upon engagement with the substrate during every exposure cycle, as opposed to being limited to a mere physisorption or chemisorption reaction of the complete precursor. A co-reactant is subsequently introduced to complete the decomposition reaction and/or remove the reaction byproducts to ensure a clean film. As such, the process requires lower thermal, chemical, or plasma-energy to grow the target film since the precursor has already partially decomposed upon reaching the substrate surface.

The decomposition of the precursor in the methods according to the disclosure is induced by three processes working in tandem: precursor adsorption to the substrate with partial removal of some ligands, thermal energy from the substrate, and soft plasma activation.

Appropriate substrates include, without limitation, those formed of a material selected from the group consisting of silicon, silicon oxide, copper, platinum, titanium, titanium nitride, tantalum and tantalum nitride.

The process described herein is equally applied to the reaction of the N-alkyl substituted perhydridocyclotrisilazanes with a nitrogen source such as, without limitation, a direct or remote $NH_3$, $N_2$, $N_2+H_2$, hydrazine, or methylamine soft plasma, to form silicon nitride ($SiN_x$); an oxygen source, such as, without limitation, a direct or remote ozone, water, or $O_2$ soft plasma, to form silicon oxide ($SiO_2$); and a reactive hydrogen source, such as a direct or remote $H_2$ soft plasma, to form pure Si. The process may also be applied to the formation of $SiC_xN_y$ compound thin films through the decomposition of N-alkyl substituted perhydridocyclotrisilazanes via exposure to a direct or remote soft plasma of a nitrogen- or carbon-containing chemical species or co-reactants. The ratio of C to N (C/N) in the films is modulated by controlling the substrate temperature and duration of the co-reactant pulse.

Specifically, control of the substrate temperature in the reaction zone of the deposition chamber affects the chemical composition of the resulting silicon-containing thin film. Specifically, in light of the chemical structure and bonding configuration of the N-alkyl substituted perhydridocyclotrisilazanes, the energetics of the reaction between the soft plasma and the source precursor at higher, but moderate, substrate temperatures (such as about 200° C. to about 650° C., preferably about 200° C. to about 350° C.) leads to the formation of SiN films, whereas low substrate temperatures (room temperature to about 200° C., preferably about 30° C. to about 200° C.) lead to the formation of $SiC_xN_y$ films consisting of a matrix of simple Si—C and Si—N bonds, with no C—N bonds. For the purposes of this disclosure, the term "room temperature" may be understood to refer to temperatures from about 20° C. to about 27° C. In both processes, a direct or remote soft plasma of a nitrogen-containing reactant, such as but not limited to $NH_3$, $N_2$, $N_2+H_2$, hydrazine, or methylamine, is exposed to the adsorbed monolayer on the substrate. A direct or remote soft plasma of a carbon-containing chemical species such as acetylene may also be employed to form the silicon carbonitride thin film. The adsorbed N-alkyl substituted perhydridocyclotrisilazane monolayer reacts with the soft plasma and undergoes conversion to a discrete atomic or molecular layer of a silicon carbonitride thin film via dissociation and/or decomposition due to or enabled by a substrate surface-induced process.

The processes according to the disclosure are distinctly different from plasma enhanced chemical vapor deposition (PE-CVD) since the formation of the film on the surface is not associated with vapor phase interactions of the precursor with plasma. While a purge step, i.e., a mechanism to remove non-adsorbed (unreacted) precursor and co-reactant, as well as byproducts from the vapor phase by vacuum or an inert gas flow is not required, such a step is preferred in some embodiments to eliminate the potential for undesirable vapor phase reactions. Such byproducts of the reaction of the parent precursor with the co-reactant and its subsequent decomposition include, for example, ligands and partial ligands from the parent molecule as well as partially decomposed precursor. Byproducts may also include partially decomposed co-reactant species and entities formed from precursor ligands and co-reactant species.

In one embodiment, aspects of the disclosure relate to the development and optimization of a plasma-activated process from one perhydridocyclotrisilazane, namely, 1,3,5-tri(isopropyl)cyclotrisilazane (TICZ, $C_9H_{27}N_3Si_3$), which contains three C atoms on each N in the form of a propyl group. The latter is eliminated at moderate temperatures in the form of the gaseous byproduct propylene, as shown in Scheme 1:

(Scheme 1)

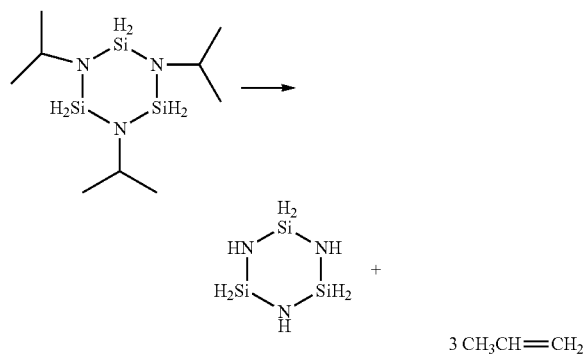

$3\ CH_3CH=CH_2$

Using such a perhydridocyclotrisilazane, thin films of $SiN_x$ (where $0<x<1.33$) may be produced at moderate temperature. A process is accordingly provided for forming $SiN_x$ thin films using an N-alkyl substituted perhydridocyclotrisilazane precursor and a nitrogen-containing soft plasma co-reactant at moderate temperature (substrate temperatures of about 200° C. to about 650° C., preferably about 200° C. to about 350° C.), and, in preferred embodiments, employing TICZ and soft remote ammonia ($NH_3$) plasma co-reactants. It may be understood that the ranges of substrate temperatures are inclusive of all temperatures within the range, so that temperatures of about 200° C. to about 650° C. include temperatures such as about 225° C., about 250° C., about 275° C., about 300° C., about 325° C., about 300° C., about 325° C., about 350° C., about 375° C., about 400° C., about 425° C., about 450° C., about 475° C., about 500° C., about 525° C., about 550° C., about 575° C., about 600° C., about ° C. 625, and about 650° C., and all temperatures in between.

This exemplary process for depositing such silicon nitride thins film onto a substrate in a reaction zone of a deposition chamber comprises, in a single cycle: heating a substrate to a temperature of about 200° C. to about 650° C., preferably about 200° C. to about 350° C.; maintaining the substrate at about 200° C. to about 650° C., preferably about 200° C. to about 350° C.; providing 1,3,5-tri(isopropyl)cyclotrisilazane in the vapor phase with a carrier gas and/or under vacuum to the reaction zone containing the substrate; forming a monolayer of the 1,3,5-tri(isopropyl)cyclotrisilazane by adsorption to the substrate surface; and exposing the adsorbed monolayer on the substrate in the reaction zone to a remote or direct soft plasma of a nitrogen-containing reactant; wherein the adsorbed 1,3,5-tri(isopropyl)cyclotrisilazane monolayer reacts with the soft plasma and undergoes conversion to a discrete atomic or molecular layer of a silicon nitride thin film via dissociation and/or decomposition due to or enabled by a substrate surface-induced process; and wherein byproducts of the conversion are removed from the reaction zone via a purge step with an inert gas and/or the vacuum. The cycle is then repeated as many times as desired to form a $SiN_x$ thin film of a desired or predetermined thickness. The nitrogen-containing chemical species or co-reactant may be, for example and without limitation, $NH_3$, $N_2$, a mixture of $N_2$ and $H_2$, methylamine, and/or hydrazine; $NH_3$ is presently preferred.

In some embodiments, after forming the monolayer of the N-alkyl substituted perhydridocyclotrisilazane by adsorption to the substrate surface, unreacted N-alkyl substituted perhydridocyclotrisilazane and byproducts thereof are removed from the reaction zone through a second purge step with an inert gas and/or the vacuum.

The compositional and optical properties of the resulting $SiN_x$ (where $0<x<1.33$) thin films have been analyzed by in-situ, real-time, spectroscopic ellipsometry and x-ray photoelectron spectroscopy (XPS), and their wet etch rates were determined using a standard IC industry etch solution. Such results are summarized and discussed below.

Accordingly, by employing the process described herein, high-quality silicon nitride ($SiN_x$) thin films may be grown by remote-plasma pulsed processes from the source precursor 1,3,5-tri(isopropyl)cyclotrisilazane (TICZ, $C_9H_{27}N_3Si_3$) and remote ammonia ($NH_3$) soft plasma on substrates such as silicon oxide ($SiO_2$) within an optimized substrate temperature window ranging from about 200° C. to 350° C. Briefly, the process consists of four-steps: TICZ pulse with no plasma, optional $N_2$ purge, $NH_3$ plasma pulse, and $N_2$ purge. As described below, as-deposited $SiN_x$ films prepared from the process described herein were analyzed by spectroscopic ellipsometry and x-ray photoelectron spectroscopy (XPS). Wet etch rates (WER) were determined using a standard solution consisting of 0.5% hydrofluoric acid (HF) in deionized water. XPS analysis yielded a Si:N ratio of ~1:1 within the entire substrate temperature range and validated the formation of the SiN phase. In situ, real-time ellipsometry measurements confirmed that $SiN_x$ growth exhibited a non-self-limiting pulsed behavior. They also yielded an as-grown $SiN_x$ average refractive index ~1.8 for the films grown at substrate temperature above 200° C.

Key findings from the development and optimization of a low-temperature process for $SiN_x$ films using the reaction of the source precursor TICZ with $NH_3$ plasma are as follows. TICZ was selected because it contains three C atoms on each N in the form of propyl groups, which are easily eliminated at moderate temperatures in the form of the gaseous byproduct propylene. TICZ is also generated in high yield and purity from readily available starting materials, as described below, thus demonstrating its suitability for high volume manufacturing. This research led to the identification of an optimized substrate temperature window ranging from 200 to 350° C. for the formation of high-quality $Si_{1.0}:N_{1.0}$ films. Wet etch studies in a standard IC industry solution consisting of 0.5% HF in deionized $H_2O$ produced viable etch rates that are competitive with those reported in the literature. Ellipsometry analyses of film nucleation and growth characteristics showed that film formation occurs instantaneously in the first deposition cycle without the existence of an incubation period, in contrast to a number of prior reports in the literature for ALD and CVD $SiN_x$, thus eliminating the need for substrate surface pre-treatments that result in additional complexity and added cost of ownership. These results demonstrate that $SiN_x$ using TICZ as a silicon source precursor is a viable option for incorporation in emerging heterodevice structures manufacturing process flows.

In another embodiment, the disclosure relates to a process for forming $SiC_xN_y$ (0.40<x<1.67 and 0.67<y<0.86) thin films using an N-alkyl substituted perhydridocyclotrisilazane precursor and a nitrogen- or caron-containing soft plasma co-reactant at low temperature (substrate temperatures of room temperature to about 200° C.), and, in preferred embodiments, employing TICZ and remote ammonia ($NH_3$) soft plasma co-reactants. This exemplary process for depositing silicon carbonitride thin films onto a substrate in a reaction zone of a deposition chamber comprises, in a single cycle: heating a substrate to a temperature of room temperature to about 200° C.; maintaining the substrate at room temperature to about 200° C.; providing 1,3,5-tri (isopropyl)cyclotrisilazane in the vapor phase with a carrier gas and/or under vacuum to the reaction zone containing the substrate; forming a monolayer of the 1,3,5-tri(isopropyl) cyclotrisilazane by adsorption to the substrate surface; and exposing the adsorbed monolayer on the substrate in the reaction zone to a remote or direct soft plasma of a nitrogen- or carbon-containing reactant; wherein the adsorbed 1,3,5-tri(isopropyl)cyclotrisilazane monolayer reacts with the soft plasma and undergoes conversion to a discrete atomic or molecular layer of a silicon carbonitride thin film via dissociation and/or decomposition due to or enabled by a substrate surface-induced process; and wherein byproducts of the conversion are removed from the reaction zone via a purge step with an inert gas and/or the vacuum. The cycle is then repeated as many times as desired to form a $SiC_xN_y$ thin film of a desired or predetermined thickness. The nitrogen-containing chemical species or co-reactant may be, for example and without limitation, $NH_3$, $N_2$, a mixture of $N_2$ and $H_2$, methylamine and/or hydrazine; $NH_3$ is presently preferred. The carbon-containing chemical species or co-reactant may be acetylene, for example.

It may be understood that the ranges of substrate temperatures are inclusive of all temperatures within the range, so that temperatures of room temperature to about 200° C. include temperatures such as about 20° C., about 25° C., about 30° C., about 45° C., about 50° C., about 60° C., about 70° C., about 80° C., about 90° C., about 100° C., about 110° C., about 120° C., about 130° C., about 140° C., about 150° C., about 160° C., about 170° C., about 180° C., about 190° C., and about 200° C., and all temperatures in between.

In some embodiments, after forming the monolayer of the N-alkyl substituted perhydridocyclotrisilazane by adsorption to the substrate surface, unreacted N-alkyl substituted perhydridocyclotrisilazane and byproducts thereof are removed from the reaction zone through a second purge step with an inert gas and/or the vacuum.

Accordingly, by employing the process described herein, high quality $SiC_xN_y$ thin films may be grown from 1,3,5-tri (isopropyl)cyclotrisilazane and soft remote ammonia ($NH_3$) plasma co-reactants. Briefly, the process involves four steps: thermal adsorption of TICZ to the substrate at low temperature (TICZ pulse with no plasma), optional nitrogen ($N_2$) purge, soft $NH_3$ remote plasma step, and $N_2$ purge. These steps are repeated until the desired film thickness is reached. The ratio of C to N in the films may be modulated by controlling the substrate temperature in the range of room temperature to about 200° C., preferably about 30° C. to about 200° C. In-situ analysis of the deposition process has been carried-out using spectroscopic ellipsometry, and the films were analyzed by x-ray photoelectron spectroscopy (XPS). The findings of this study indicate that the combination of reduced substrate thermal budget and soft remote plasma provides an optimum low energy environment for the controlled deposition of $SiC_xN_y$ protective coatings on thermally fragile, chemically sensitive substrates, including plastics and polymers.

As described below, it has been found that low (near room temperature) $SiC_xN_y$ deposition using TICZ and soft remote ammonia ($NH_3$) plasma as co-reactants yielded $SiC_xN_y$ thin films with 0.40<x<1.67 and 0.67<y<0.86 in the substrate temperature range of 30 to 150° C. XPS analysis indicated that the $SiC_xN_y$ films consisted predominantly of a temperature-independent matrix of simple cross-linked Si—C and Si—N bonds. In situ, real-time, angle-resolved ellipsometry showed that all films were grown in a plasma pulse regime, with film nucleation and growth occurring instantaneously without an incubation period similar to that reported in the literature for ALD and P-CVD work. This feature makes this $SiC_xN_y$ process attractive from a manufacturing perspective due to the elimination of ex-situ or in-situ pre-deposition substrate surface treatments, leading to an increase in process efficiency and a reduction in both process steps and cost of ownership. These findings therefore demonstrate that applying a soft remote plasma in concert with a reduced substrate thermal budget where TICZ and $NH_3$ co-reactants are directed to react only on the substrate surface constitutes a promising approach for growing of $SiC_xN_y$ protective coatings within a low energy environment for potential applications that require thermally fragile, chemically sensitive substrates, including plastics and polymers.

In a further embodiment, the disclosure relates to a method for deposition of a silicon oxide thin film onto a substrate in a reaction zone of a deposition chamber. The method comprises, in a single cycle: heating a substrate to a temperature of about 200° C. to about 650° C., preferably about 200° C. to about 350° C.; maintaining the substrate at about 200° C. to about 650° C., preferably about 200° C. to about 350° C.; providing a precursor comprising a N-alkyl substituted perhydridocyclotrisilazane in the vapor phase with a carrier gas and/or under vacuum to the reaction zone containing the substrate; forming a monolayer of the N-alkyl substituted perhydridocyclotrisilazane by adsorption to the substrate surface; and exposing the adsorbed monolayer on the substrate in the reaction zone to a remote or direct soft plasma of an oxygen-containing reactant; wherein the adsorbed N-alkyl substituted perhydridocyclotrisilazane monolayer reacts with the soft plasma and undergoes conversion to a discrete atomic or molecular layer of a silicon oxide thin film via dissociation and/or decomposition due to or enabled by a substrate surface-induced process; and wherein byproducts of the conversion are removed from the reaction zone by an inert gas through a purge step and/or the vacuum. The cycle is then repeated as many times as desired to form a silicon oxide thin film of a desired or predetermined thickness. The oxygen-containing chemical species or co-reactant may be, for example and without limitation, ozone, $O_2$, and water. The preferred N-alkyl substituted perhydridocyclotrisilazane is TICZ.

It may be understood that the ranges of substrate temperatures are inclusive of all temperatures within the range, so that temperatures of about 200° C. to about 650° C. include temperatures such as about 225° C., about 250° C., about 275° C., about 300° C., about 325° C., about 300° C., about 325° C., about 350° C., about 375° C., about 400° C., about 425° C., about 450° C., about 475° C., about 500° C., about 525° C., about 550° C., about 575° C., about 600° C., about 625° C., and about 650° C., and all temperatures in between.

In some embodiments, after forming the monolayer of the N-alkyl substituted perhydridocyclotrisilazane by adsorption to the substrate surface, unreacted N-alkyl substituted perhydridocyclotrisilazane and byproducts thereof are removed from the reaction zone through a second purge step with an inert gas and/or the vacuum.

In a further embodiment, the disclosure provides a method for deposition of a silicon thin film onto a substrate in a reaction zone of a deposition chamber, the method comprising, in a single cycle: heating a substrate to a temperature of about 200° C. to about 650° C., preferably about 200° C. to about 350° C.; maintaining the substrate at about 200° C. to about 650° C., preferably about 200° C. to about 350° C.; providing a precursor comprising a N-alkyl substituted perhydridocyclotrisilazane in the vapor phase with a carrier gas and/or under vacuum to the reaction zone containing the substrate; forming a monolayer of the N-alkyl substituted perhydridocyclotrisilazane by adsorption to the substrate surface; and exposing the adsorbed monolayer on the substrate in the reaction zone to a remote or direct soft plasma of a hydrogen-containing reactant; wherein the adsorbed N-alkyl substituted perhydridocyclotrisilazane monolayer reacts with the soft plasma and undergoes conversion to a discrete atomic or molecular layer of a silicon thin film via dissociation and/or decomposition due to or enabled by a substrate surface-induced process; and wherein byproducts of the conversion are removed from the reaction zone by an inert gas through a purge step and/or the vacuum. The cycle is then repeated as many times as desired to form a silicon oxide thin film of a desired or predetermined thickness. The hydrogen-containing chemical species or co-reactant may be, for example and without limitation, $H_2$. The preferred N-alkyl substituted perhydridocyclotrisilazane is TICZ.

It may be understood that the ranges of substrate temperatures are inclusive of all temperatures within the range, so that temperatures of about 200° C. to about 650° C. include temperatures such as about 225° C., about 250° C., about 275° C., about 300° C., about 325° C., about 300° C., about 325° C., about 350° C., about 375° C., about 400° C., about 425° C., about 450° C., about 475° C., about 500° C., about 525° C., about 550° C., about 575° C., about 600° C., about 625° C., and about 650° C., and all temperatures in between.

In some embodiments, after forming the monolayer of the N-alkyl substituted perhydridocyclotrisilazane by adsorption to the substrate surface, unreacted N-alkyl substituted perhydridocyclotrisilazane and byproducts thereof are removed from the reaction zone through a second purge step with an inert gas and/or the vacuum.

The invention will now be described in conjunction with the following, non-limiting examples.

Example 1: Formation of SiN Thin Film

Synthesis of Precursor

Under an argon atmosphere, a 5-liter 4-necked flask equipped with a cooling bath, overhead stirrer, pot thermometer, sub-surface dip-tube, and dry-ice condenser was charged with 909 grams of methyl t-butyl ether. The mixture was cooled to −40° C., and then 303.0 grams (3 moles) of dichlorosilane were slowly added to the pot. 364.7 grams (6.0 moles) of isopropylamine were then added via dip-tube at temperatures in the range of −30 to −20° C. over a period of 2.5 hours. After the addition was completed, the reaction mixture was slowly warmed up to 25° C. and stirred at this temperature for 8 to 14 hours. This step was followed by the addition of 177.4 g (3 moles) of isopropylamine at temperatures in the range of 0 to 40° C., and the subsequent addition of another 227.3 grams of methyl t-butyl ether. The mixture was stirred for 6 to 16 hours and monitored by gas chromatography (GC). The reaction solution was then filtered and solvents were removed from the filtrates under reduced pressure below 50° C. The filtering process was repeated, with fractional distillation of the clear filtrates yielding 64.5 g (24.66) of TiCZ.

TICZ vapor pressure was determined by a combination of distillation temperature, pressure readings (<10 torr), and pressure-cell DSC measurements (>10 torr). The latter employed a TA Instruments Pressure DSC 25P instrument utilizing Tzero Hermetic Pinhole (75 μm) Lids, 2-5 mg sample size, and a 15° C./min ramp rate. FIG. 1 provides actual vapor pressure data from distillation and DSC measurements, as well as Antoine Equation's fit [Log(P)=A−B/(C+T)] over the range of 0.14 to 760 torr.

Processing Conditions for SiN Thin Film Deposition

A Picosun R-200 R&D system equipped with a sample load-lock to maintain the cleanliness and vacuum integrity of the reaction chamber and a remote inductively-coupled plasma (ICP) power source was employed in process development and optimization. All depositions were performed on substrates consisting of 1000 nm-thick silicon dioxide thermally grown on n-doped Si wafers, acquired from Addison Engineering. The samples were loaded as-received and were subjected to an in-situ $NH_3$ plasma clean at a plasma frequency of 13.56 MHz and a plasma power of 2000 W for five minutes before each deposition run.

The TICZ precursor was loaded in a specialized bubbler which was connected to the Picosun precursor manifold system and heated to 50° C. All delivery lines were also heated to 90° C. to inhibit premature precursor condensation prior to entering the reaction chamber. $N_2$ gas was used as carrier gas and set at 100 sccm.

Figure 2:
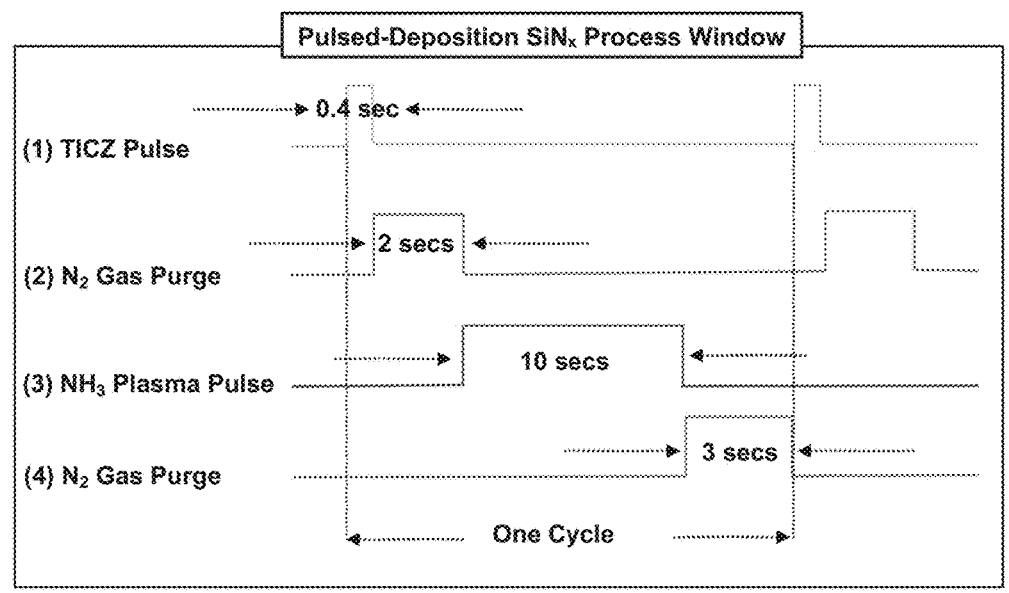
FIG. 2 is an optimized $SiN_x$ process window schematic for various substrate temperatures ranging from 50 to 350° C.

Process development and optimization for $SiN_x$ from the reaction of TICZ and $NH_3$ plasma was carried out in two phases. In a first "proof-of-concept" phase, a systematic set of screening experiments were conducted to identify optimum values for the duration of the TICZ pulse, purge step, and $NH_3$ plasma pulse, as well as $N_2$ purge gas flow rate, $NH_3$ remote plasma flow rate, and plasma power. In a second "process optimization" phase, the key experimental parameters were set as shown in FIG. 2 and the substrate temperature was varied from 50° C. to 350° C. in 50° C. intervals. Precursor exposure and plasma pulse durations and purge times were identical for substrate temperatures of 50, 150, 200, 250, 300, and 350° C., except no precursor purge time was applied in the 350° C. run. $NH_3$ remote plasma frequency, flow rate, and power were set at 13.56 MHz, 40 sccm, and 2000 W, respectively. The samples were subsequently transferred to the load lock system and allowed to cool to room temperature in a $N_2$ atmosphere prior to removal from the Picosun system.

For XPS analysis, the $SiN_x$ samples were capped with an approximately 10-15 nm-thick zinc oxide ($ZnO_x$) layer to prevent surface contamination during transport and handling. The ALD ZnO, process employed 100 cycles of the reaction of diethyl-zinc (DEZ) as the Zn source and water as the oxygen source. $ZnO_x$ was grown in-situ immediately following and at the same temperature as the $SiN_x$ deposition, except in the case of the 50° C. sample, in which the temperature was increased to 150° C. for the $ZnO_x$ deposition. The process consisted of a four-steps: 0.1 sec DEZ pulse, 5 secs $N_2$ purge, 0.1 sec water vapor pulse, 5 secs $N_2$ purge.

Analytical Techniques

In-situ, real-time, angle-resolved ellipsometry was performed using a Woollam iSE ellipsometer at wavelengths ranging from 400 to 1000 nm. The ellipsometer system was mounted directly on the P-CVD (pulsed-CVD) reaction chamber, with the incident light beam being directed onto the substrate through a quartz glass window at an incident angle of 60.8°, and the reflected light beam being captured by a detector. The resulting data was analyzed using CompleteEASE software. The substrate was modelled as a ~1000 nm-thick thermal $SiO_2$ layer on Si. The thickness of the $SiO_2$ layer was measured in-situ prior to every P-CVD run.

XPS was carried out at Eurofins EAG Materials Science, LLC on a PHI Quantum 2000 system. X-rays were generated from a monochromated $Alk_\alpha$ source at 1486.6 eV and directed at the sample at a ±230 acceptance angle and 45° take-off angle. In-depth compositional analysis was performed with an $Ar^+$ ion gun at 2 keV, 4 mm×2 mm raster, and 3.8 nm/min sputter rate. No deconvolution was applied to the data since the Si, N, C, and O peaks were well separated from each other. All data processing (integration) was performed using CasaXPS software from Casa Software Ltd. Montage plots were generated using MultiPak software, produced by Ulvac-phi, Inc. Depth profile plots were produced using Microcal Origin, manufactured by Microcal Software, Inc. High-resolution XPS peaks assignments were performed following the calibration procedure described in ISO 15472:2010 "Surface chemical analysis—X-ray photoelectron spectrometers—Calibration of energy scales."

Wet etch studies were conducted using an IC industry standard solution consisting of 0.5% hydrofluoric acid (HF) in deionized water at room temperature.

Precursor Analysis

One additional advantage of 1,3,5-tri(isopropyl)cyclotrisilazane (TICZ, $C_9H_{27}N_3Si_{13}$) is that it was generated at high yield and purity from readily available starting materials, as described above. This ensures its suitability for high volume manufacturing. Pertinent properties of TICZ are displayed in Table I and its vapor pressure versus temperature parameters are shown in FIG. 1. It should be noted that the precursor synthesis recipe described earlier can also produce other analogs, such as 1,3,5-tri(ethyl)cyclotrisilazane and 1,3,5-tri(t-butyl)cyclotrisilazane, which have different volatility and deposition characteristics.

TABLE I

Chemical Structure and Properties of TICZ

| Property | Value | Comments |
|---|---|---|
| Chemical Structure | | |
| Boiling Point (° C.) | 67-68 @ 1.8 torr | |
| Density (g/cm³) | 0.919 @ 20° C. | |
| Vapor Pressure (torr) | ~1 torr @ 70° C. | See FIG. 1 |
| FTIR | vS-H:2113.6 (vs) | |
| ¹HNMR (CDCl₃): | 1.29 (d, 18H) | |
| | 3.38 (m, 3H) | |
| | 4.80 (s, 6H) | |

Ellipsometry Analysis

Figure 3:
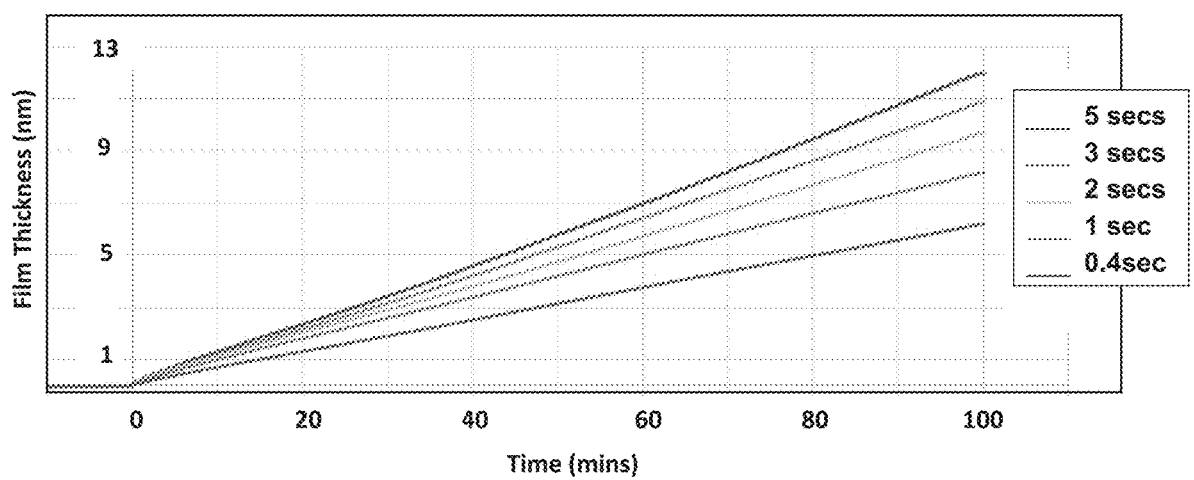
FIG. 3 is a graph of in-situ, real-time, ellipsometry measurements of film thickness versus deposition time for substrate temperature of 200° C. for TICZ exposure times of 0.4 sec, 1.0 sec, 2.0 secs, 3.0 secs, and 5.0 secs.

FIG. 3 depicts in-situ, real-time ellipsometry profiles of film thickness versus duration of deposition for films grown at 200° C. substrate temperature for TICZ pulse times of 0.4 sec, 1.0 sec, 2.0 secs, 3.0 secs, and 5.0 secs. As shown in the profiles, film thickness continues to increase with precursor pulse time and does not saturate, regardless of precursor pulse time. This behavior shows that the TICZ adsorption step is not self-limiting and supports the assertion that the growth of $SiN_x$ films does not occur through an ALD process. The same film thickness dependence on pulse time was observed within the entire substrate temperature range investigated, from 50° C. to 350° C., indicating that film formation does not occur through an ALD growth mode within all the process windows investigated.

Figure 4:
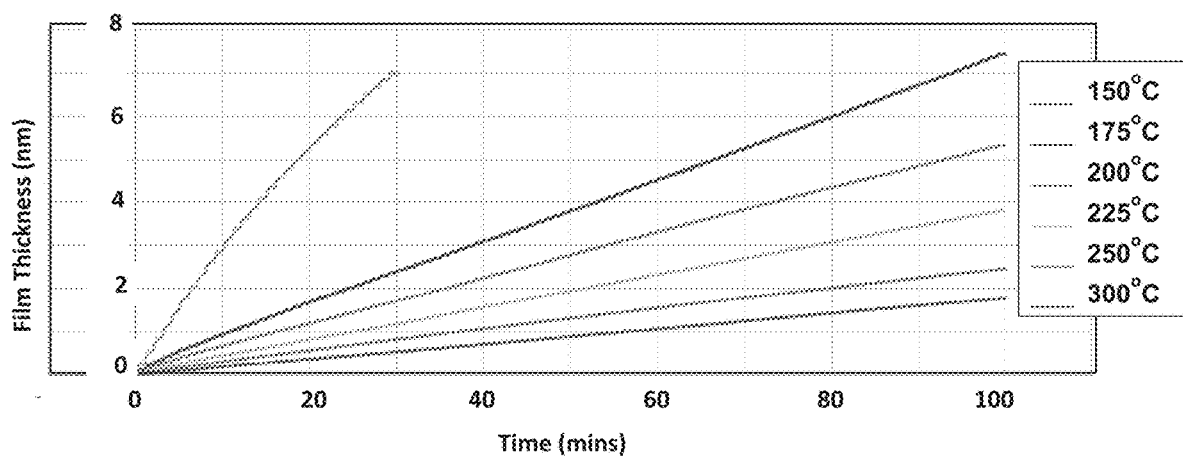
FIG. 4 is a graph of in-situ, real-time, ellipsometry measurements of film thickness versus deposition time for substrate temperatures of 150, 175, 200, 225, 300, and 350° C.
Figure 5:
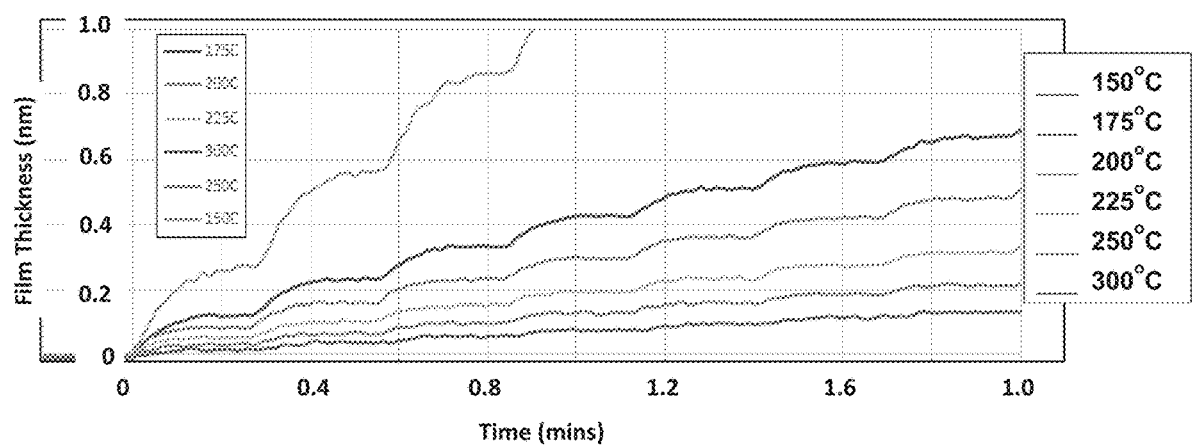
FIG. 5 is a graph of in-situ, real-time, ellipsometry measurements of film thickness versus deposition time for the first minute of $SiN_x$ processing.

Similarly, FIGS. 4 and 5 display plots of in-situ, real-time, ellipsometry measurements of film thickness versus deposition time for substrate temperatures of 150, 175, 200, 225, 300, and 350° C. As expected, FIG. 4 shows that film thickness increases with longer deposition time. However, a gradual decrease in the slope of each film thickness curve is also observed with higher substrate temperature. This decrease is indicative of a reduction in growth rate per cycle (GPC) with the rise in substrate temperature. It is suggested that the decline in GPC is attributed to a reduction in precursor partial vapor pressure in the reaction zone in proximity of the substrate. This decrease is believed to be possibly due to the geometry of the deposition chamber, which induces additional heating at the point of entry of the precursor into the reactor with increased substrate temperature, leading to some precursor decomposition prior to reaching the reaction zone. Alternatively, the decrease could be caused by a higher frequency of recombination of precursor species and associated ligands with the rise in thermal budget, and their subsequent desorption from the substrate surface, thus restricting the TICZ and $NH_3$ reaction rate.

Furthermore, FIG. 5 shows that film formation occurs instantaneously in the first deposition cycle without the manifestation of an incubation period or delay in film nucleation and growth, in contrast to a number of prior reports in the literature for $SiN_x$ produced from ALD and CVD. This feature is important as it negates the requirement for substrate surface pre-treatments, thus eliminating added complexity and cost in the incorporation of $SiN_x$ deposition in heterodevice structures manufacturing process flows. In addition, Table II presents ellipsometry-derived values for film thickness, growth rate per cycle (GPC), and index of refraction for as-deposited $SiN_x$ films as a function of substrate temperature.

TABLE II

Selected Properties of $SiN_x$, as Determined by Ellipsometry, XPS, and Wet etching

| Substrate Temperature (° C.) | Film Thickness (nm) | Growth Rate (nm/cycle) | Optimum Etch Rate (nm/min) | Refractive index |
|---|---|---|---|---|
| 50 | 2947.6 | 0.590 | 2309.7 | 1.491 |
| 150 | 289.3 | 0.231 | 732 | 1.513 |
| 200 | 87.3 | 0.029 | 98.5 | 1.800 |
| 250 | 101.9 | 0.025 | 25.2 | 1.813 |
| 300 | 104.1 | 0.021 | 12.2 | 1.807 |
| 350 | 57.5 | 0.019 | 2.4 | 1.815 |

XPS Analysis

Figure 6:
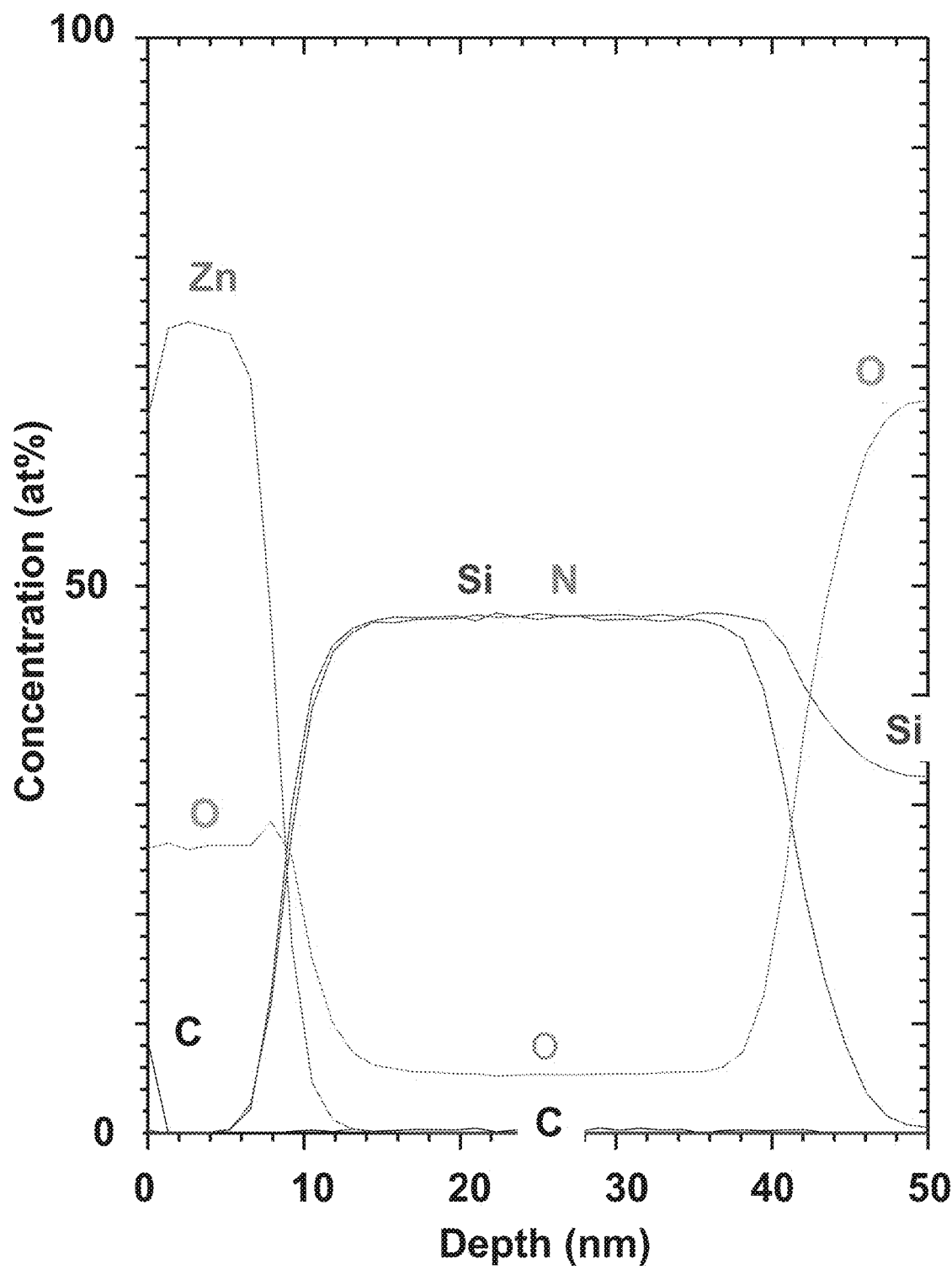
FIG. 6 is an XPS profile of Zn, Si, N, C, and O concentrations versus penetration depth in $SiN_x$ films deposited at 200° C.
Figure 7:
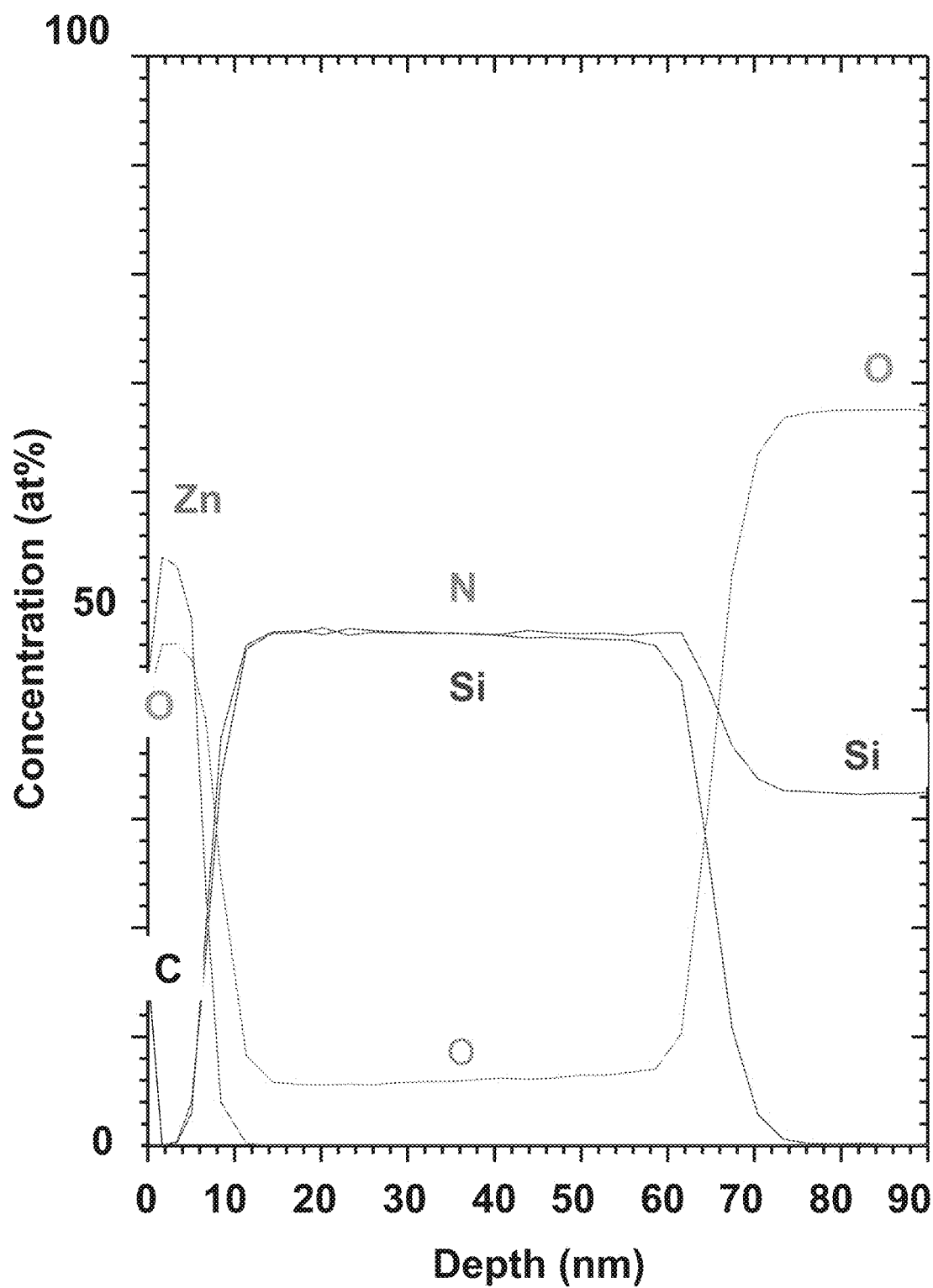
FIG. 7 is an XPS profile of Zn, Si, N, C, and O concentrations versus penetration depth in $SiN_x$ films deposited at 300° C.

Selected film thicknesses were also confirmed by XPS depth profile analyses. Zn, Si, N, C, and O concentrations versus penetration depth in $SiN_x$ films were assessed by XPS depth profile analyses, as shown in FIGS. 6 and 7 for as-deposited $SiN_x$ films grown at substrate temperatures of 200° C. and 300° C., respectively.

The measurements yielded decreasing C concentrations of ~42 at % and ~15 at % for films grown at 50° C. and 150° C. substrate temperatures, respectively. The value declined to below the detection limits of XPS above 200° C. substrate temperature, as can be seen in FIG. 6. The XPS results therefore indicate that 200° C. provides the minimum thermal budget required for efficient reaction of TICZ and $NH_3$, leading to complete precursor dissociation, and removal of reaction byproducts from the deposition zone. Similarly, O concentrations of ~11 at % and ~6 at % were recorded for films grown at 50° C. and 150° C. substrate temperatures, respectively. The value declined to ~5 at % above 200° C. substrate temperature, as shown in FIG. 6. Oxygen inclusion is attributed to O diffusion during the in-situ P-CVD zinc oxide ($ZNO_x$) capping layer deposition step.

Table III provides representative $SiN_x$ atomic concentrations within the bulk of films grown at 200° C., 250° C., and 300° C. at a depth of ~25 nm. The data in Table III, as well as FIGS. 6 and 7, demonstrate that samples deposited above 200° C. consisted of Si:N ratio of ~1:1.

Figure 8:
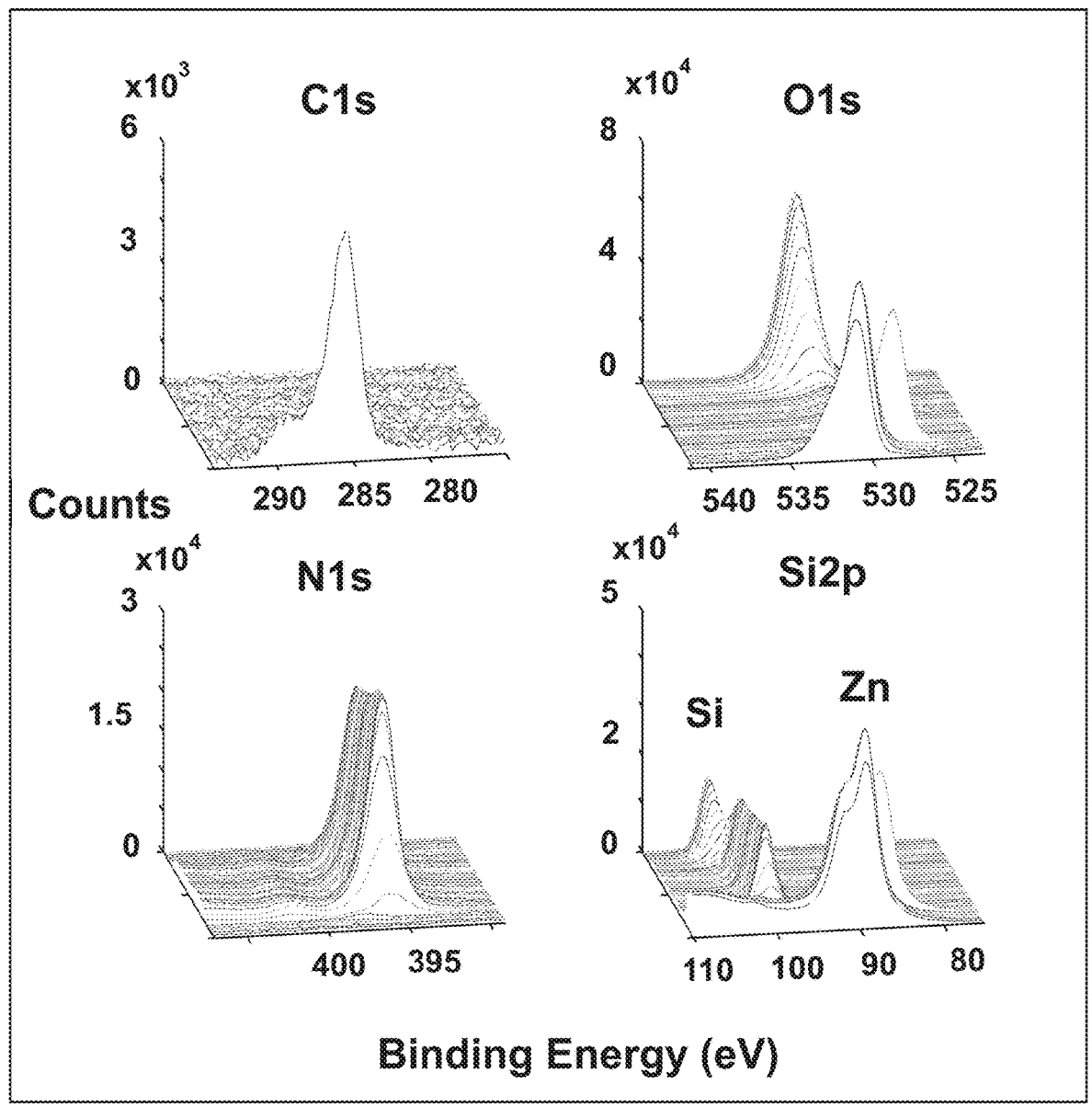
FIG. 8 depicts high-resolution XPS spectra for Si2p, N1s, C1s, and O1s binding energies versus penetration depth in $SiN_x$ films deposited at 200° C.
Figure 9:
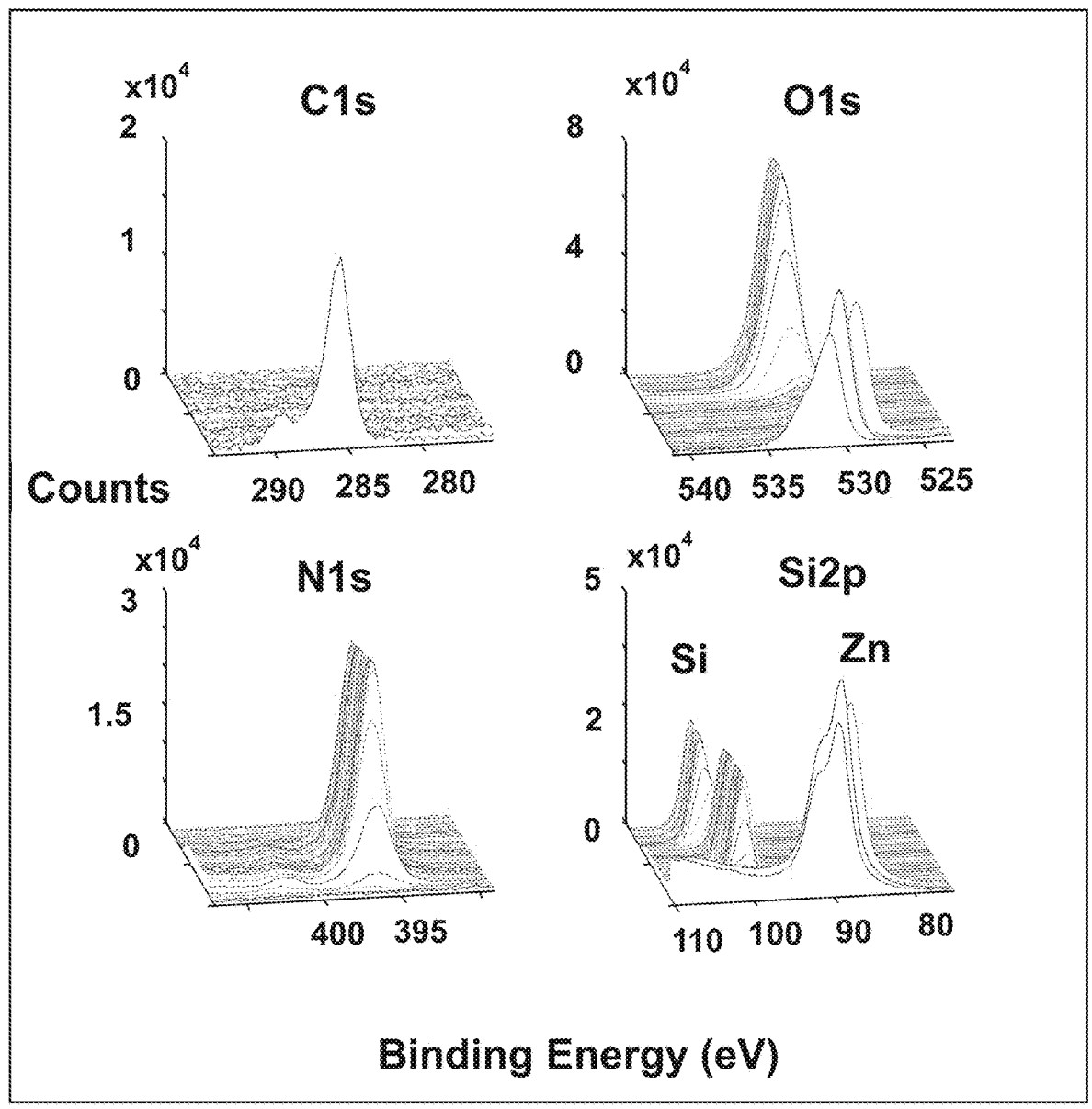
FIG. 9 depicts high-resolution XPS spectra for Si2p, N1s, C1s, and O1s binding energies versus penetration depth in $SiN_x$ films deposited at 300° C.

High-resolution XPS spectra for Si2p, N1s, C1s, and O1s binding energies versus penetration depth are displayed in FIGS. 8 and 9 for $SiN_x$ films deposited at 200° C. and 300° C., respectively. The data demonstrate that both sets of films consisted of a SiN phase with a low concentration of O and practically no C inclusion. It should be noted that the N1s spectra contained a main peak attributed to $N(-Si)_3$, which is due to Si—N bonding, nitride and a minor peak attributed to $O-N(-Si)_2$, which is associated with silicon oxynitride ($Si_xN_yO_z$).

TABLE III

Representative $SiN_x$ Atomic concentrations (in at %)
Within the Bulk of Films Grown at 200, 250, and 300° C.

| Substrate Temperature (° C.) | Depth in Sample (nm) | C | N | O | Si |
| --- | --- | --- | --- | --- | --- |
| 200 | ~25 | ~0.7 | ~47.5 | ~3.2 | ~48.5 |
| 250 | ~25 | ~0.2 | ~46.9 | ~5.4 | ~47.5 |
| 300 | ~25 | ~0.0 | ~47.2 | ~5.6 | ~47.3 |

Wet Etch Rate

Wet etch studies were conducted using an IC industry standard solution consisting of 0.5% hydrofluoric acid (HF) in deionized water. The results are summarized in Table II. The wet etch rates observed for films deposited at 300° C. are competitive with those reported in prior art including, for example, for LPCVD films grown at 770° C. and PE-ALD films deposited at 250° C. etched in a milder etch solution consisting of 1:300 HF:$H_2O$ solution; and PE-ALD films grown between 270 and 350° C. and treated in a more diluted wet etch solution consisting of 1:500 HF:$H_2O$.

Example 2: Formation of SiCxNy Thin Film

Experimental Deposition Conditions

All experiments were performed in the same Picosun R-200 R&D reactor described earlier. $SiC_xN_y$ film growth experiments were conducted in two stages. In a first screening stage, systematic scoping experiments were performed to establish optimized run parameters, including process working pressure, remote $NH_3$ plasma power, and precursor, $NH_3$, and $N_2$ flow rates, as well as the length of the pre-deposition plasma treatment step, and the duration of the TICZ, $N_2$ purge, and remote $NH_3$ plasma pulse steps. Once this stage was completed and appropriate experimental parameter sets were identified, a second process optimization stage was implemented to determine $SiC_xN_y$ compositional, physical, and chemical properties as a function of substrate temperature in the range of 30° C. to 200° C. For this stage, the $NH_3$ flow rate was kept constant at 40 sccm, while remote plasma power and frequency were set at 2000 W and 13.56 MHz, respectively. Table IV summarizes the key run parameters.

TABLE IV

Key Processing Parameters for Soft Remote Plasma $SiC_xN_y$ Deposition

| Processing Parameter | Value | Description |
| --- | --- | --- |
| Precursor | TICZ ($C_9H_{27}N_3Si_3$) @ 50° C. | ![structure] |
| Substrate Temperature | 30-200° C. | 30, 50, 60, 90, 120, 150, 170, 200 |
| TICZ Pulse Duration | 0.4 s | ($N_2$ carrier gas @ 100 sccm) |
| $N_2$ Purge | 2.0 s | @ 100 sccm |
| $NH_3$ Remote Plasma Pulse | 10.0 s | @ 40 sccm, 2000 W |
| $N_2$ Purge | 3.0 s | @ 100 sccm |
| $ZnO_x$ Capping Layer | Standard ALD Process Diethyl Zinc (DEZ) and $H_2O$ (10-15 nm thick) | 0.1 s DEZ pulse, 5 s $N_2$ purge, 0.1 s $H_2O$ pulse, 5 s $N_2$ purge. |

The $SiC_xN_y$ growth runs were followed in-situ with the deposition of an approximately 10 to 15 nm-thick zinc oxide ($ZnO_x$) capping layer to prevent $SiC_xN_y$ contamination upon exposure to air and during subsequent transport and handling. For the $ZnO_x$ step, a standard ALD process was employed. The substrate temperature was maintained at the same value as the $SiC_xN_y$ deposition step, except in the case of the 50° C. $SiC_xN_y$ film, for which the temperature was increased to 150° C. for the $ZnO_x$ growth step. The ALD $ZnO_x$ process employed the reaction of diethyl zinc (DEZ) and water ($H_2O$) as the Zn and O sources, respectively: it involved a 0.1 s DEZ pulse and 0.1 s $H_2O$ vapor pulse, separated by 5 s $N_2$ purge each.

At the conclusion of each deposition run, the samples were transferred back into the load lock system and kept under a $N_2$ atmosphere until they cooled down to room temperature prior to removal from the Picosun system.

Analytical Techniques

To study the composition and chemical bonding characteristics of the $SiC_xN_y$ films, the same analytical techniques were employed as previously described.

XPS Analysis

Figure 10:
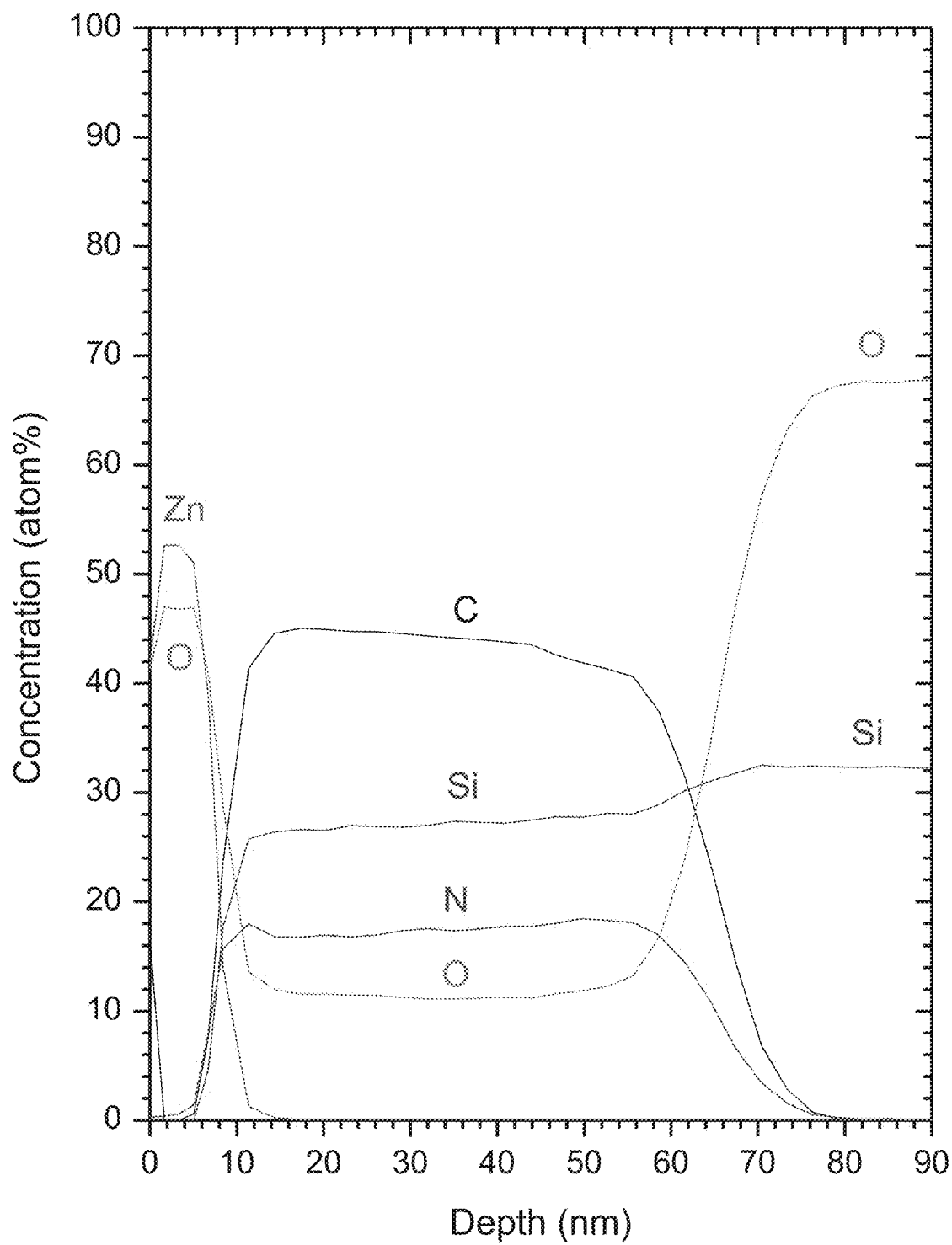
FIG. 10 is an XPS depth profile of Zn, Si, N, C, and O concentrations for $SiC_xN_y$ films deposited at 50° C.
Figure 11:
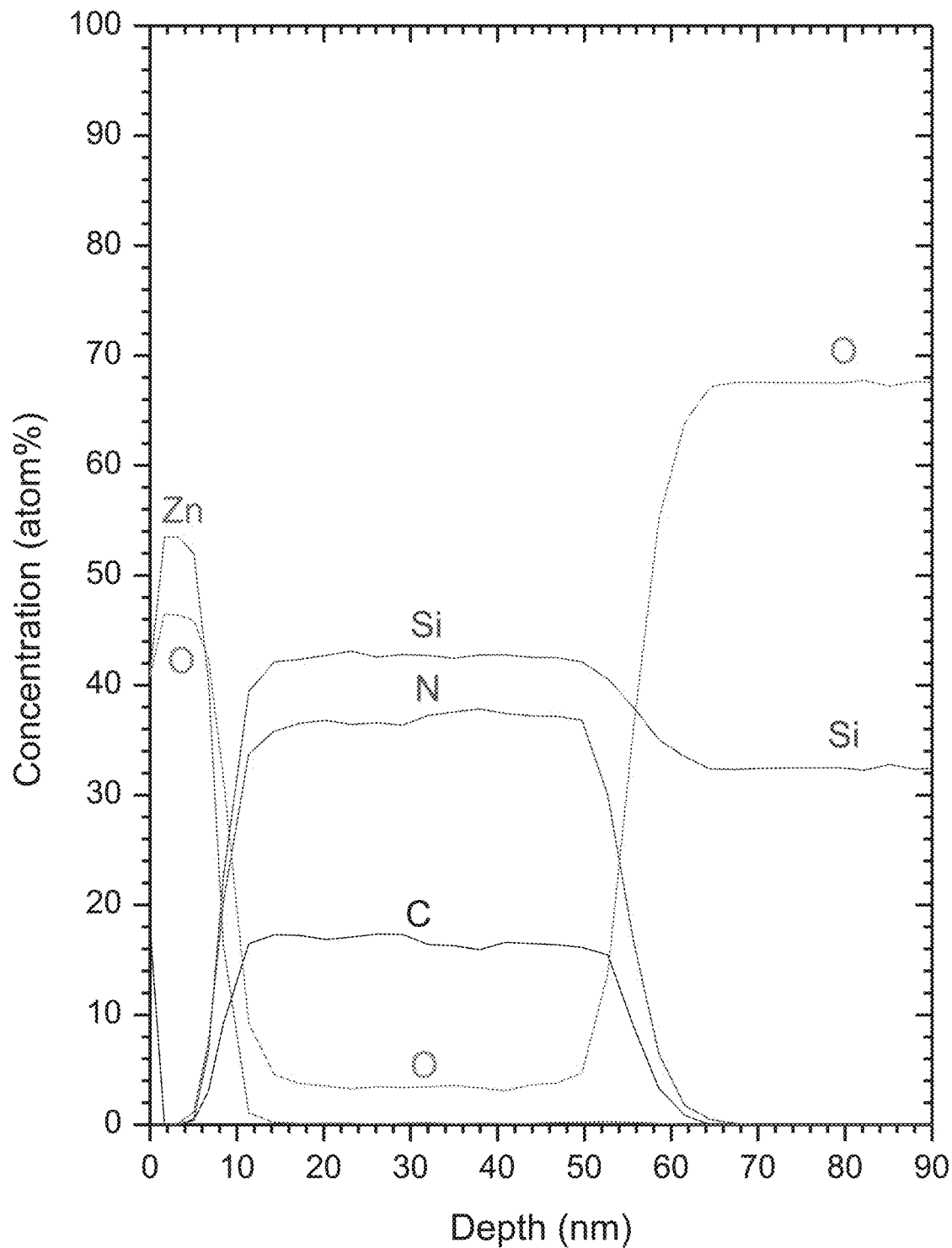
FIG. 11 is an XPS depth profile of Zn, Si, N, C, and O concentrations for $SiC_xN_y$ films deposited at 150° C.

Table V presents representative atomic concentration percentages of Si, C, N, and O in films deposited at 50, 150, and 200° C. The values were determined by quantitative XPS analysis, as shown in FIGS. 10 and 11 for $SiC_xN_y$ samples deposited at 50 and 150° C., respectively.

TABLE V

Representative Atomic concentrations (in at % rounded to the nearest whole number) Within the Bulk of $SiC_xN_y$ Films Grown at Various Substrate Temperatures

| Substrate Temperature (° C.) | Depth in Sample (nm) | Si | C | N | O |
|---|---|---|---|---|---|
| 50  | ~25 | ~27 | ~45 | ~18 | ~10 |
| 150 | ~25 | ~43 | ~17 | ~37 | ~3  |
| 200 | ~25 | ~48 | ~0  | ~48 | ~5  |

Oxygen content in the films was ~10 at % at 50° C. and decreased to 3-5 at % at higher temperatures. The presence of this small concentration of O could be due to $H_2O$ reaction with $SiC_xN_y$ during the subsequent in-situ ALD $ZnO_x$ capping layer step. It could also result from impurities in $NH_3$ or $N_2$ and/or the well-known issue of plasma etching of the $Al_2O_3$ dielectric liners that are employed in ICP plasma sources. A gradual decrease in C concentration was also observed at higher substrate temperature, while the N content exhibited a steady increase, as seen in Table V and in FIGS. 10 and 11.

These trends are consistent with the observation that the combination of reduced substrate thermal budget and soft remote plasma provides an optimum low energy environment for the alkyl groups to undergo a gradual and controlled dissociation reaction from the parent molecule; a rise in substrate temperature provides increased thermal activation energy for a higher degree of bond dissociation as well as Si, C, and N bond re-distribution within the $SiC_xN_y$ film.

Figure 12:
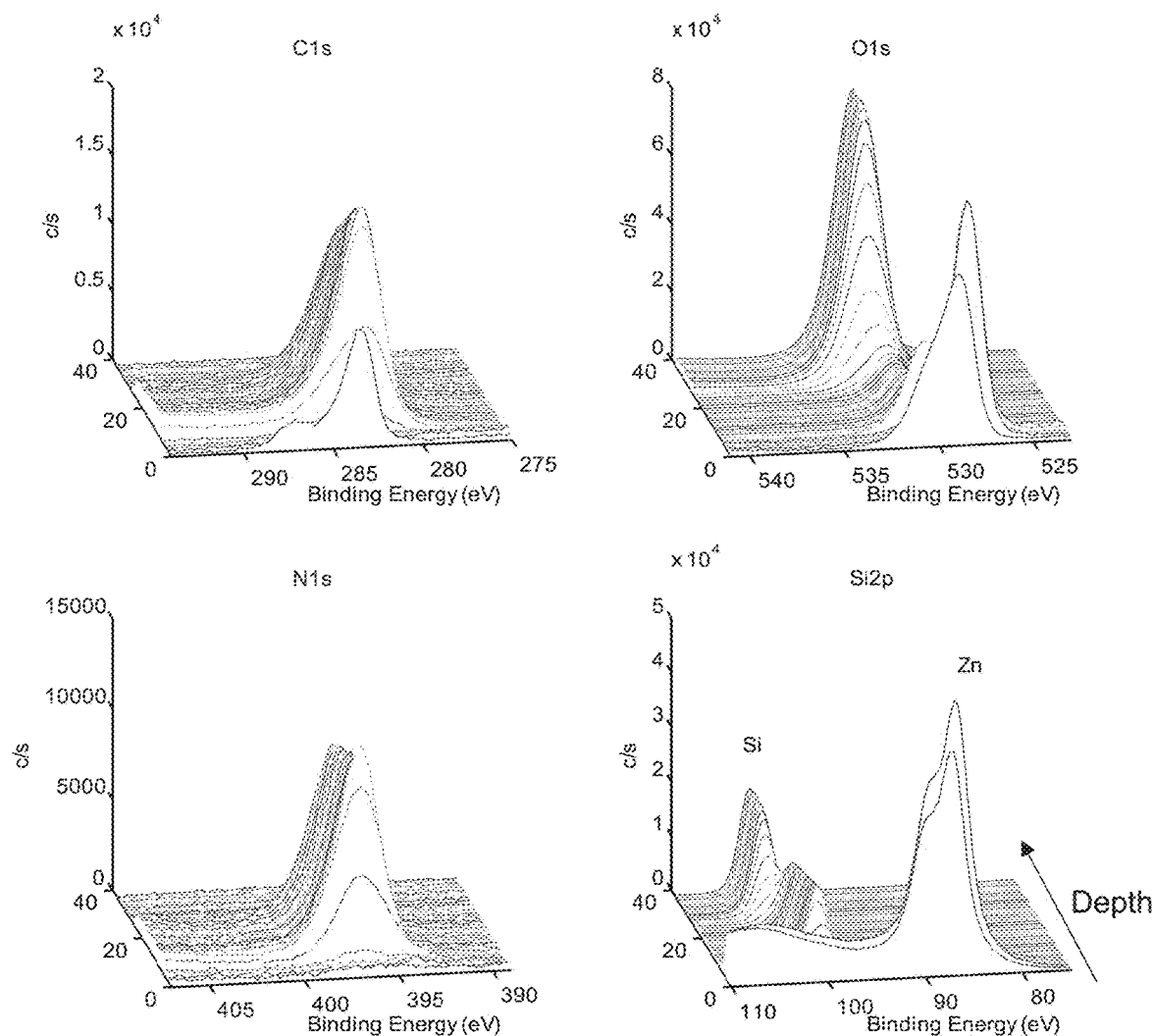
FIG. 12 depicts high-resolution XPS core level spectra for Si 2p, N 1s, C 1s, and O 1s binding energies versus penetration depth in $SiC_xN_y$ films deposited at 50° C.
Figure 13:
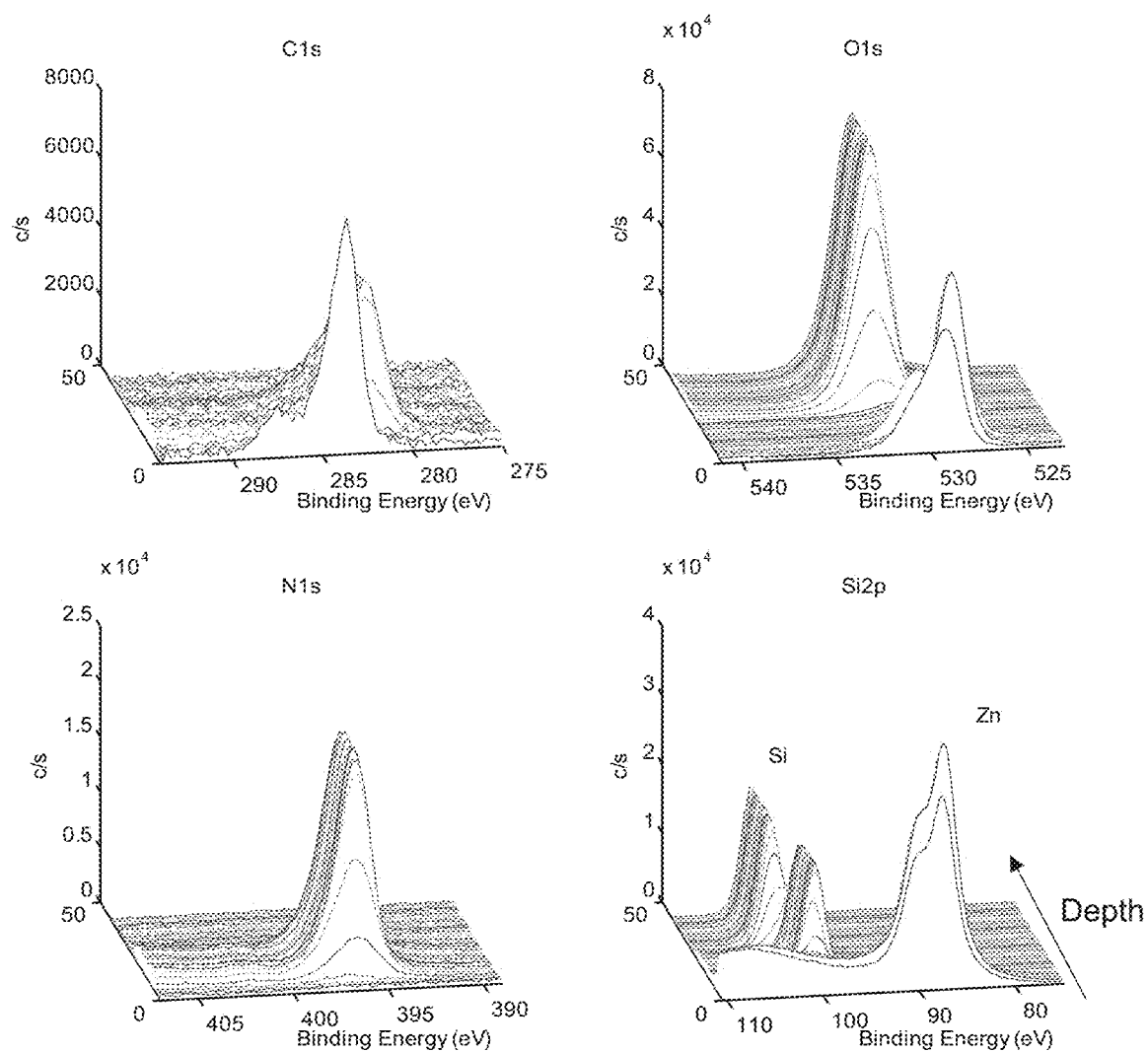
FIG. 13 depicts high-resolution XPS core level spectra for Si2p, N1s, C1s, and O1s binding energies versus penetration depth in $SiC_xN_y$ films deposited at 150° C.

High-resolution XPS core level spectra for Si 2p, N 1s, C 1s, and O 1s binding energies versus penetration depth in $SiC_xN_y$ were also compiled for the samples deposited at 50 and 150° C., respectively, as shown in FIGS. 12 and 13. Based on the XPS analysis, the location of the Si, N, C, and O core levels peaks appears to be independent of film composition and process thermal budget. More specifically, within the 30 to 150° C. substrate temperature window investigated, the C 1s peak location at ~283.3 eV is attributed to C—Si bonds, while the N 1s peak position at ~397.3 eV is due to N—Si bonds, regardless of the substrate temperature used. Concurrently, the Si 2p peak is composed of contributions from Si—C bonds at ~100.4 eV and Si—N bonds at ~101.7 eV, with perhaps a negligible contribution from Si—O bonds at 103 eV.

The high-resolution XPS analysis seems to indicate that the $SiC_xN_y$ films consist predominantly of a matrix of simple cross-linked Si—C and Si—N bonds for substrate temperatures ≤150° C. No C is observed in the films within XPS detection limits at 200° C., with the Si 2p and N 1s peaks corresponding to a SiN phase.

This results are radically different from previously described films. In the latter, an evolution was reported that the C1s peak in $SiC_xN_y$ underwent a transition from C—C to C—Si to C—N type bonds as function of increased substrate temperature, while the N 1s peak exhibited a transition from N—C to predominantly N—Si bonding with some contribution from N—C type bonds. Concurrently, the Si 2p were reported to evolve from Si—N, Si—O, and Si—C type bonding to mainly Si—Si bonds, along with Si—N and Si—C bonds. These results were attributed to the presence of various temperature-dependent complex bonding configurations in previously described $SiC_xN_y$ films. Unlike previously reported films, the simple Si—C and Si—N bonds in the inventive $SiC_xN_y$ films, with no changes in the bonding configuration or chemical structure as function of temperature, provide a stable and consistent $SiC_xN_y$ matrix for applications that require thermally fragile, chemically sensitive substrates, including plastics and polymers.

The results described and demonstrated herein are different from prior findings in the literature, e.g., atmospheric pressure plasma CVD (AP-PECVD) from triethylsilane ($HSiEt_3$, TES) and $N_2$ as Si, C, and N sources. In the latter, it was reported that the C 1s peak indicated an evolution from C—C to C—Si to C—N type bonds, while the N 1s peak exhibited a transition from N—C to predominantly N—Si bonding with some contribution from N—C type bonds. Concurrently, the Si 2p were reported to evolve from Si—N, Si—O, and Si—C type bonding to mainly Si—Si bonds, along with Si—N and Si—C bonds. These results were attributed to the presence of various temperature-dependent complex bonding configurations in a-SiCN films, as described in a number of other reports by various researchers.

XPS analysis therefore supports the assertion that applying a soft remote plasma in concert with a reduced substrate thermal budget in a pulsed mode where the N-alkyl substituted perhydridocyclotrisilazane precursor and $NH_3$ co-reactant are directed to react only on the substrate surface does yield: (i) a $SiC_xN_y$ matrix with a temperature-independent bonding configuration of simple cross-linked Si—C and Si—N bonds: and (ii) a gradual and controlled decrease in C content with increasing substrate temperature.

Ellipsometry Analysis

Figure 14:
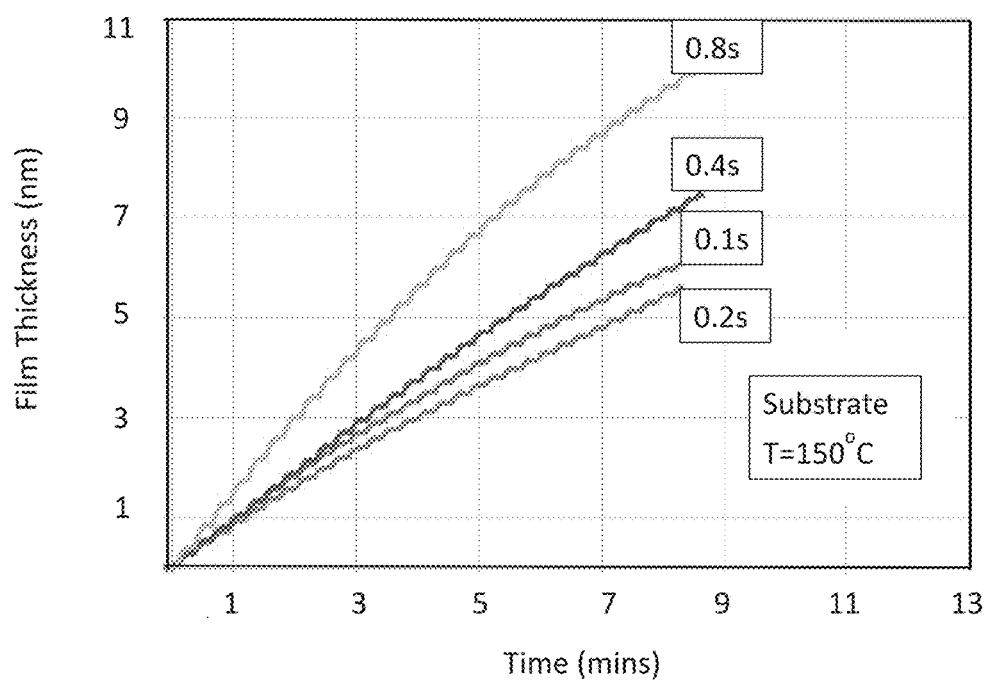
FIG. 14 is a graph of in-situ, real-time, angle-resolved ellipsometry measurements of $SiC_xN_y$ film thickness versus deposition time for a substrate temperature of 150° C. and TICZ pulse times of 0.1 second, 0.2 second, 0.4 second, and 0.8 second.

In-situ, real-time ellipsometry studies were implemented for the adsorption and reaction pathways of the TICZ source precursor and $NH_3$ remote plasma, as well as the resulting $SiC_xN_y$ film nucleation and growth profiles, in order to determine the nature and characteristics of the pulsed deposition process. To this end, FIG. 14 displays $SiC_xN_y$ film thickness as a function of deposition time for TICZ pulse times of 0.1, 0.2, 0.4, and 0.8 s. Substrate temperature was maintained at 150° C. in all runs. The data indicate that film thickness exhibits a steady rise with higher TICZ pulse durations and does not reach a plateau at which it ceases to increase, as would have been expected in an ALD process. It should be noted that this trend is observed across the entire substrate temperature window investigated, indicating that the pulsed deposition of $SiC_xN_y$ does occur in a P-CVD rather than an ALD regime. One advantage of the plasma pulsed mode is the potential partial decomposition of the parent TICZ precursor upon adsorption to the substrate surface and prior to reaction with $NH_3$, a feature that is conducive to film deposition in a lower thermal budget window.

Figure 15:
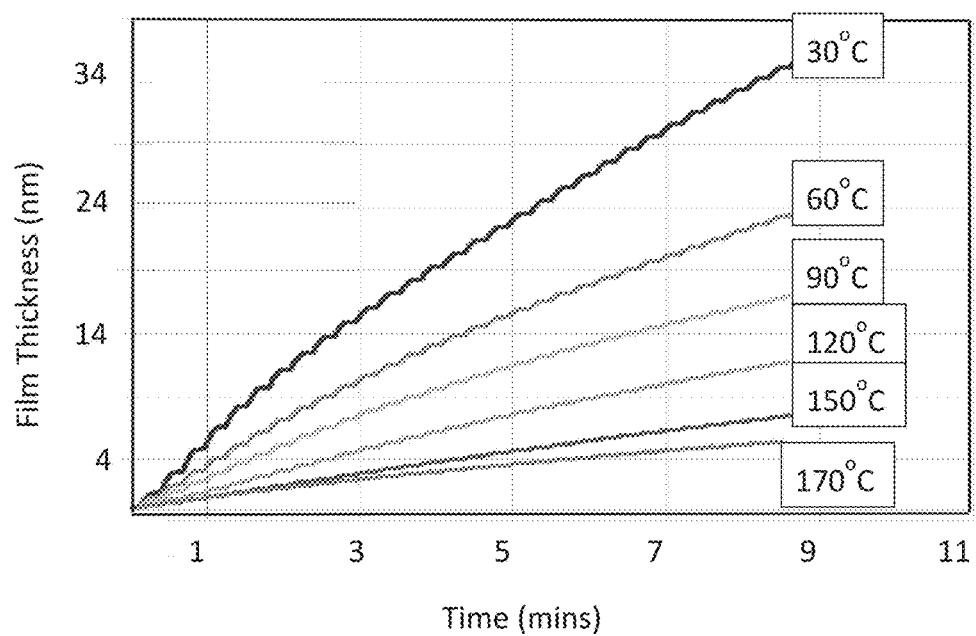
FIG. 15 is a graph of in-situ, real-time, angle-resolved ellipsometry measurements of $SiC_xN_y$ film thickness versus deposition time for substrate temperatures of 30, 60, 90, 120, 150, and 170° C.

Similarly, FIG. 15 provides in-situ, real-time, angle-resolved ellipsometry measurements of film thickness versus deposition time for substrate temperatures of 30, 60, 90, 120, 150, and 170° C. The plots show that film nucleation and growth occur instantaneously, as indicated by the immediate rise in film thickness within the first deposition cycle. This feature is important, as it demonstrates the absence of an incubation period prior to the onset of $SiC_xN_y$ film formation, as has been reported in the literature for other ALD and P-CVD work. The absence of such an incubation period makes plasma pulsed $SiC_xN_y$ more attractive from a manufacturing perspective by eliminating ex-situ or in-situ pre-deposition substrate surface treatments, thereby resulting in a reduction in the number of process steps required to grow $SiC_xN_y$ thin films.

Additionally, FIG. 15 shows a gradual decrease in the slope of the film thickness curves, and thus the $SiC_xN_y$ growth rate per cycle, with increasing substrate temperature.

The reduction in GPC at higher substrate temperatures could potentially be caused by: (i) a decrease in TICZ partial vapor pressure in proximity to the substrate due to the geometry of the reactor, which induces a gradual rise in precursor decomposition at its point of entry into the chamber and prior to reaching the substrate, and/or (ii) a higher rate of desorption of the precursor and associated moieties from the substrate surface prior to the $NH_3$ co-reactant step due to the rise in thermal budget. Finally, ex-situ ellipsometry measurements yielded refractive indices of ~1.49, ~1.51, and ~1.80 for the films deposited at 50, 150, and 200° C., respectively.

Wet Etch Rates

Wet etch rate (WER) studies produced values of 2310, 732, and 99 nm/min for the films grown at 50, 150, and 200° C., respectively.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A method for deposition of a silicon nitride thin film onto a substrate in a reaction zone of a deposition chamber, the method comprising, in a single cycle:
    selecting a precursor comprising a N-alkyl substituted perhydridocyclotrisilazane;
    determining a temperature required to physisorb and partially decompose the precursor with no chemisorption by removing one ligand from the precursor upon contact with the substrate but not effect complete dissociation of the precursor;
    heating the substrate to the predetermined temperature;
    maintaining the substrate at the predetermined temperature;
    providing the precursor in the vapor phase with a carrier gas and/or under vacuum to the reaction zone containing the substrate;
    forming a monolayer of the partially decomposed N-alkyl substituted perhydridocyclotrisilazane by physisorption to the substrate surface; and
    performing a single plasma-activated process per deposition cycle by exposing the adsorbed monolayer on the substrate in the reaction zone to a remote or direct low energy soft plasma consisting of a single hydrogen- and nitrogen-containing reactant using a single set of processing parameters after formation of the partially decomposed monolayer;
    wherein the adsorbed partially decomposed N-alkyl substituted perhydridocyclotrisilazane monolayer reacts with the soft plasma provided in the single plasma-activated process and undergoes conversion to a discrete atomic or molecular layer of a silicon nitride thin film via dissociation and/or decomposition due to or enabled by a substrate surface-induced process selected from the group consisting of energy transfer, remote plasma application, direct plasma application, oxidation, and/or reduction;
    wherein growth of the discrete atomic or molecular layer of the silicon nitride thin film occurs during the single cycle without any incubation period; and
    wherein byproducts of the conversion are removed from the reaction zone via a purge step with an inert gas and/or the vacuum.

2. The method according to claim 1, further comprising after forming the monolayer of the N-alkyl substituted perhydridocyclotrisilazane by adsorption to the substrate surface, removing unreacted N-alkyl substituted perhydridocyclotrisilazane and byproducts thereof from the reaction zone through a second purge step with an inert gas and/or the vacuum.

3. The method according to claim 1, wherein the substrate temperature is about 200° C. to about 650° C.

4. The method according to claim 3, wherein the substrate temperature is about 200° C. to about 350° C.

5. The method according to claim 1, wherein the N-alkyl substituted perhydridocyclotrisilazane is 1,3,5-tri(isopropyl)cyclotrisilazane.

6. The method according to claim 1, wherein the nitrogen-containing reactant comprises $NH_3$, a mixture of $N_2$ and $H_2$, methylamine, and/or hydrazine.

7. The method according to claim 1, wherein the single cycle is repeated until a thin film of a predetermined thickness is achieved.

8. The method according to claim 1, wherein the silicon nitride film contains no detectable hydrogen.

9. The method according to claim 1, wherein the N-alkyl substitutedperhydridocyclotrisilazane is 1,3,5-tri(isopropyl)cyclotrisilazane, the substrate temperature is 200° C. to 300° C., and the silicon nitride film contains no detectable hydrogen.

* * * * *